US009673693B2

(12) United States Patent
Ohshima

(10) Patent No.: US 9,673,693 B2
(45) Date of Patent: Jun. 6, 2017

(54) OVERCURRENT PROTECTION POWER SUPPLY APPARATUS

(71) Applicant: Shunzou Ohshima, Toyokawa (JP)

(72) Inventor: Shunzou Ohshima, Toyokawa (JP)

( * ) Notice: Subject to any disclaimer, the term of this patent is extended or adjusted under 35 U.S.C. 154(b) by 0 days.

(21) Appl. No.: 14/397,750

(22) PCT Filed: Apr. 30, 2013

(86) PCT No.: PCT/JP2013/062661
§ 371 (c)(1),
(2) Date: Jan. 13, 2015

(87) PCT Pub. No.: WO2013/165004
PCT Pub. Date: Nov. 7, 2013

(65) Prior Publication Data
US 2015/0123629 A1 May 7, 2015

(30) Foreign Application Priority Data

May 1, 2012 (JP) .................. 2012-104973
Mar. 6, 2013 (JP) .................. 2013-044793

(51) Int. Cl.
*H02M 1/32* (2007.01)
*H02M 3/158* (2006.01)
*H03K 17/082* (2006.01)

(52) U.S. Cl.
CPC ............. *H02M 1/32* (2013.01); *H02M 3/158* (2013.01); *H03K 17/0822* (2013.01); *H03K 2217/0027* (2013.01); *H03K 2217/0063* (2013.01)

(58) Field of Classification Search
CPC .......... H02M 3/15; H02M 1/32; H03K 17/08; H03K 17/081; H03K 17/08104;
(Continued)

(56) References Cited

U.S. PATENT DOCUMENTS 4,430,608 A    2/1984 Nesler
4,890,009 A   12/1989 Miyazaki et al.
(Continued)

FOREIGN PATENT DOCUMENTS

CN     1964191 A    5/2007
CN   102064807 A    5/2011
(Continued)

OTHER PUBLICATIONS

Extended European Search Report from the European Patent Office dated Nov. 10, 2015 in related EP application No. 13 784 450.2, including European Search Opinion, European Search Report, and examined claims 1-8.
(Continued)

*Primary Examiner* — Gustavo Rosario Benitez
(74) *Attorney, Agent, or Firm* — J-TEK Law PLLC; Jeffrey D. Tekanic; Scott T. Wakeman

(57) ABSTRACT

In a high voltage power supply apparatus, e.g., for an electric or hybrid vehicle, current is supplied from a high-voltage DC power source to a load via a power FET. A voltage detecting circuit detects the drain-source voltage $V_{DS}$ of the power FET when the current flows through the power FET. A first overcurrent protection signal generating circuit outputs a first overcurrent protection signal based on the detected drain-source voltage $V_{DS}$ of the power FET. A second overcurrent protection signal generating circuit outputs a second overcurrent protection signal based on a detected rate of increase of the drain-source voltage $V_{DS}$ of the power FET. A control circuit protects the components of the power supply apparatus from overcurrents by turning off the FET when the first overcurrent protection signal and/or the second overcurrent protection signal is generated and output to the control circuit.

20 Claims, 8 Drawing Sheets

(58) Field of Classification Search
CPC ......... H03K 17/0812; H03K 17/08122; H03K 17/0814; H03K 17/08142; H03K 17/082; H03K 17/0822; H03K 2217/0063; H03K 2217/0027

See application file for complete search history.

(56) References Cited

U.S. PATENT DOCUMENTS

| | | | |
|---|---|---|---|
| 4,929,884 | A | 5/1990 | Bird et al. |
| 4,937,697 | A | 6/1990 | Edwards et al. |
| 5,783,915 | A | 7/1998 | Shida et al. |
| 5,905,615 | A | 5/1999 | Rivetti et al. |
| 5,914,586 | A | 6/1999 | Fujita et al. |
| 5,998,981 | A | 12/1999 | Houghton et al. |
| 6,222,355 | B1 | 4/2001 | Ohshima et al. |
| 6,441,679 | B1* | 8/2002 | Ohshima ............ H03K 17/0822 323/282 |
| 7,030,582 | B2 | 4/2006 | Masino |
| 7,079,368 | B2 | 7/2006 | Ishikawa et al. |
| 7,177,130 | B2 | 2/2007 | Ohshima |
| 7,248,452 | B2 | 7/2007 | Ohshima |
| 7,443,645 | B2 | 10/2008 | Ohshima |
| 8,315,028 | B2 | 11/2012 | Ohshima |
| 2001/0010458 | A1 | 8/2001 | Ohshima |
| 2002/0012216 | A1 | 1/2002 | Ohshima |
| 2004/0207967 | A1 | 10/2004 | Ohshima |
| 2004/0222759 | A1 | 11/2004 | Ohshima |
| 2004/0228057 | A1* | 11/2004 | Mayama ............ H03K 17/0822 361/100 |
| 2005/0088130 | A1 | 4/2005 | Ohshima |
| 2005/0104546 | A1 | 5/2005 | Ohshima |
| 2005/0116672 | A1 | 6/2005 | Ohshima |
| 2005/0157441 | A1 | 7/2005 | Black |
| 2005/0275990 | A1 | 12/2005 | Ohshima |
| 2005/0286200 | A1 | 12/2005 | Ohshima |
| 2006/0007626 | A1 | 1/2006 | Ohshima |
| 2006/0187604 | A1 | 8/2006 | Ohshima |
| 2007/0008672 | A1 | 1/2007 | Ohshima |
| 2007/0064368 | A1 | 3/2007 | Ohshima |
| 2007/0103832 | A1 | 5/2007 | Ohshima |
| 2007/0139841 | A1 | 6/2007 | Ohshima |
| 2009/0027096 | A1* | 1/2009 | Mourrier ............ H03K 17/166 327/170 |
| 2009/0167272 | A1* | 7/2009 | Furuichi ............ H03K 17/0822 323/284 |
| 2010/0014195 | A1* | 1/2010 | Takahashi .......... H03K 17/0822 361/18 |
| 2010/0110599 | A1 | 5/2010 | Ohshima |
| 2010/0118461 | A1 | 5/2010 | Ohshima |
| 2010/0127677 | A1 | 5/2010 | Ohshima |
| 2011/0019323 | A1 | 1/2011 | Ohshima |
| 2011/0075309 | A1 | 3/2011 | Ohshima |
| 2011/0085275 | A1 | 4/2011 | Ohshima |
| 2011/0110009 | A1 | 5/2011 | Sugimoto et al. |
| 2012/0153914 | A1 | 6/2012 | Ohshima et al. |
| 2012/0170166 | A1* | 7/2012 | Nagasawa .............. H02H 3/07 361/92 |
| 2012/0236456 | A1* | 9/2012 | Yu ...................... H03K 17/0822 361/91.1 |

FOREIGN PATENT DOCUMENTS

| | | |
|---|---|---|
| CN | 102017414 B | 7/2014 |
| EP | 1176685 A1 | 1/2002 |
| EP | 1693942 A1 | 8/2006 |
| JP | 3706515 B2 | 10/2005 |
| JP | 2006060971 A | 3/2006 |
| JP | 2008283641 A | 11/2008 |
| JP | 2009071370 A | 4/2009 |
| JP | 201056602 A | 3/2010 |
| JP | 2012227845 A | 11/2012 |
| JP | 2012235398 A | 11/2012 |
| JP | 2014054157 A | 3/2014 |

OTHER PUBLICATIONS

English translation of International Preliminary Report on Patentability from parent application No. PCT/JP2013/062661 dated Nov. 4, 2014.

English translation of International Search Report from parent application No. PCT/JP2013/062661 dated Jun. 11, 2013.

English translation of previously-filed Office Action from the Chinese Patent Office dated Aug. 1, 2016 in counterpart Chinese application No. 20138002344169.

Office Action from the Chinese Patent Office dated Jan. 17, 2017 in counterpart Chinese application No. 20138002344169, and translation thereof.

Office Action from the Chinese Patent Office dated Aug. 1, 2016 in counterpart Chinese application No. 20138002344169.

Search Report from the Chinese Patent Office dated Jul. 14, 2016 in counterpart Chinese application No. 20138002344169.

* cited by examiner

OVERCURRENT PROTECTION POWER SUPPLY APPARATUS

CROSS-REFERENCE

This application is the US national stage of International Patent Application No. PCT/JP2013/062661 filed on Apr. 30, 2013, which claims priority to Japanese Patent Application No. 2012-104973 filed on May 1, 2012 and to Japanese Patent Application No. 2013-044793 filed on Mar. 6, 2013.

TECHNICAL FIELD

The present invention generally relates to a power supply apparatus that supplies electric power from a direct current power source to a load via a field effect transistor (FET), and for example, to a power supply apparatus having the function of protecting circuit elements of the power supply apparatus and the load against overcurrents.

BACKGROUND

The overcurrent protection power supply apparatus shown in FIG. 5 is disclosed in Japanese Patent No. 3706515.

The overcurrent protection power supply apparatus 101 shown in FIG. 5 comprises a switch circuit 102, a control circuit 105, an overcurrent detecting circuit 108, multisource FET 109 and a temperature sensor 112. The multisource FET 109 has N type metal oxide semiconductor field effect transistors (MOSFETs) 111 and 110. The temperature sensor 112 detects the temperature of the MOSFET 111.

Such a overcurrent protection power supply apparatus 101 is used as a power supply apparatus that supplies electric power to a load from a relatively low voltage DC power source 117 (for example, a 12V or 24V DC power source installed in a vehicle).

This known overcurrent protection power supply apparatus 101 operates as follows.

When the switch 103 is turned on, the control circuit 105 turns on the MOSFETs 110 and 111, so that electric power is supplied from the DC power source 117 to the load 116.

If the current $I_D$ flowing through the MOSFET 111 becomes an overcurrent, the voltage $V_{DS}$ between the drain and the source of the MOSFET 111 increases, and the current detection voltage $V_B$ decreases and becomes less than a reference voltage $V_A$ ($V_A > V_B$). As a result, the output of a comparator 107 becomes a high level. That is, an overcurrent detection signal is output from the comparator 107. When the overcurrent detection signal is output from the overcurrent detecting circuit 108, the control circuit 105 turns off the MOSFETs 111 and 110.

Furthermore, when it is determined by using a temperature signal from the temperature sensor 112 that the temperature of the MOSFET 111 exceeds a predetermined temperature, the control circuit 105 turns off the MOSFETs 111 and 110.

For example, in case the insulating film of the gate of the MOSFET 111 or the MOSFET 110 is partially damaged, a leakage current may flow between the gate and the source. When the leakage current increases, the voltage drop across resistor 106 increases. As a result, the source-gate voltages of the MOSFET 111 and the MOSFET 110 increase. Thus, the MOSFETs 111 and 110 generate heat due to the increase of the on-resistance. In this situation, the current $I_D$ does not increase, and it may even slightly decrease. Therefore, an overcurrent detection signal will not be output from the overcurrent detecting circuit 108. As a result, the heat generation state of the MOSFETs 111 and 110 continues and there is a risk of damage. The temperature sensor 112 is provided in order to protect the components against such an overheating.

SUMMARY OF THE INVENTION

A conventional overcurrent protection power supply apparatus can not be used as a power supply apparatus that supplies electric power (current) to a load from a high voltage DC power source (e.g. a 500V DC power source installed in an electric vehicle or a hybrid vehicle, etc.), because the following problems exist.

The ground resistance when a ground fault occurs is 20-50 mmΩ. Moreover, in the above-described known overcurrent protection power supply apparatus, the time required from the occurrence of the ground fault until the MOSFET turns off (protection reaction time) is 10 μs. Therefore, in case the voltage of the DC power source is 12V (hereinafter referred to as a "12V power source system"), the current (ground current) reaches about 100 A during the protection reaction time (about 10 μs). On the other hand, in case the voltage of the DC power source is 500V (hereinafter referred to as a "500V power source system"), the current (ground current) reaches about 1500 A during the protection reaction time (about 10 μs). That is, in a 500V power source system, as compared to a 12V power source system, an overcurrent that is about 15 times greater may flow.

In addition, because there is necessarily an inductance (L) in the current path in which the ground current (I) flows, electromagnetic energy [L×I²/2] accumulates in this current path. This electromagnetic energy is consumed or dissipated by being converted into heat in the turned-off MOSFET 111. Since the overcurrent that flows in a 500V power source system is about 15 times greater than in a 12V power source system, the accumulated electromagnetic energy is about 225 times (15×15=225) greater than in the case of a 12V power source system. That is, in a 500V power source system, the MOSFET 111 is heated by electromagnetic energy that is 225 times greater than in the case of a 12V power source system.

In case the voltage of the DC power source is high (as compared to the case that the voltage of the DC power source is low), because a larger overcurrent flows through the MOSFET(s) and the FET(s) is (are) heated by a larger amount of electromagnetic energy, the MOSFET(s) can not be adequately protected by known protection circuits.

Therefore, in a power supply apparatus that supplies electric power to a load from a high voltage DC power source (e.g. 500V as compared to 12V or a 24V), semiconductor devices such as MOSFETs are rarely used as power switching devices; instead mechanical switching devices are still used.

One object of the present teachings is to disclose techniques for overcoming these problems and, e.g., enable FETs to be used in high voltage systems.

According to a first aspect of the present teachings, an overcurrent protection power supply apparatus preferably includes a power switching device and a control circuit. A FET (Field Effect Transistor), typically a MOSFET (Metal Oxide Semiconductor Field Effect Transistor), is preferably used as the power switching device. In addition, the overcurrent protection power supply apparatus is configured to perform an overcurrent protection operation for protecting the FET from overcurrents by utilizing the drain-source voltage of the FET and the rate of increase of the drain-source voltage as parameters.

An apparatus according to the first aspect of the present teachings preferably comprises a FET, a control circuit, a drain-source voltage detecting circuit, a drain source voltage detection initiation circuit, a first overcurrent protection signal generating circuit and a second overcurrent protection signal generating circuit.

The drain-source voltage detecting circuit detects the drain-source voltage generated between the drain and the source by the drain current flowing in the FET. It is noted that the term "drain-source voltage" means "the magnitude of the drain-source voltage" unless otherwise specified. Furthermore, the expression "detect the drain-source voltage" means detecting the magnitude of the drain-source voltage or detecting a value corresponding to the magnitude of the drain-source voltage. Furthermore, in a circuit configuration that "detects the drain-source voltage", it is possible to output (the magnitude of) the drain-source voltage or to output the result of a comparison of (the magnitude of) the drain-source voltage with a threshold value.

When the FET is turned on to start the supply of electric power (current) to the load, the drain-source voltage detection initiation circuit initiates the detecting operation of the drain-source voltage by the drain-source voltage detecting circuit after the magnitude of the drain-source voltage of the FET increases in accordance with an increase of the magnitude of the drain current of the FET. It is noted that the drain current of the FET is nearly equal to the source current of the FET. Thus, in the present specification, the drain current and the source current of the FET are collectively called "the drain current". By using the drain-source voltage detection initiation circuit, it is possible to prevent the FET from being incorrectly shut off by an inrush current when the FET is turned on.

The first overcurrent protection signal generating circuit outputs a first overcurrent protection signal based on the drain-source voltage of the FET. Typically, it outputs the first overcurrent protection signal when the drain-source voltage has increased.

The second overcurrent protection signal generating circuit outputs a second overcurrent protection signal based on the rate of increase of the drain-source voltage. Typically, it outputs the second overcurrent protection signal when the rate of increase of the drain-source voltage has increased.

The control circuit performs an overcurrent protection operation that turns off the FET when it receives the first overcurrent protection signal or the second overcurrent protection signal.

In this aspect of the present teachings, because the overcurrent protecting operation is performed based on (i) the drain-source voltage of the FET by using the first overcurrent protection signal and/or (ii) the rate of increase of the drain-source voltage of the FET by using the second overcurrent protection signal, it is possible to reliably protect the FET(s) and other circuit components against overcurrents. Therefore, even in case electric current is supplied to a load from a high voltage DC power source, such as a 500V power supply, one or more FETs can be used as the power switching device(s).

An apparatus according to a second aspect of the present teachings preferably comprises a FET, a control circuit, a drain-source voltage detecting circuit, a drain-source voltage detection initiation circuit and a first overcurrent protection signal generating circuit.

The drain-source voltage detecting circuit is configured to detect the drain-source voltage in accordance with a magnitude determination that utilizes a threshold value. As a circuit configuration that "detects the drain-source voltage in accordance with a magnitude determination that utilizes a threshold value", it is possible to compare the magnitude of the drain-source voltage with the threshold value and output the comparison result and to detect the range in which the drain-source voltage exists.

Further, the drain-source voltage detecting circuit is configured such that the threshold value varies according to the electric potential of an electrode of the DC power source side of the FET. The term "an electrode of the DC power source side of the FET" means the electrode, from among the main electrodes (drain, source) of the FET, that is on the DC power source side (the side connected to the positive electrode of the DC power source). The phrase "according to" encompasses the meanings of "proportional to" and "approximately proportional to".

In case a ground fault has occurred at a point between the FET and the load, the current (ground current) flowing in the FET initially increases rapidly, then increases slowly, and then saturates. The larger the current in a saturated state (the attained current value) is, the larger the rate of increase of the current is.

By linking or correlating the threshold value to the electric potential of the electrode of the DC power source side of the FET, the resistance value between the FET and ground that generates the drain-source voltage, which is equal to the threshold value when the saturated current flows through the FET, can be specified. In addition, the relationship between the threshold value and the potential of the electrode of the DC power source side of the FET is set such that the drain-source voltage is equal to the threshold value when the current is saturated in case the resistance between the FET and ground is equal to an upper limit of a resistance range corresponding to a current value range that has been determined to be an overcurrent, and is set such that the drain-source voltage is larger than the threshold value when the current is saturated in case the resistance is less than the resistance at the upper limit.

As a result of this, the higher the attained current value at the time of saturation (the larger the rate of increase) is, the earlier the time point is when the first overcurrent protection signal is output from the first overcurrent protection signal generating circuit (the time point when the overcurrent protecting operation is performed). That is, the second overcurrent protection signal generating circuit, which outputs the second overcurrent protection signal used in the first aspect of the present teachings, is not required in such embodiments.

It is noted that, if the channel temperature of the FET varies, the on-resistance of the FET varies and thereby the resistance between the FET and ground varies, which resistance generates the drain-source voltage that is equal to the threshold value when the saturated current flows. Therefore, it is preferable to design the circuit such that, even if the channel temperature of the FET varies, the relationship between the pre-set threshold value and the electric potential of the electrode of the DC power source side of the FET does not vary. For example, the relationship between the threshold value and the electric potential of the electrode of the FET may be set by using the on-resistance at an arbitrary operating ambient temperature and then the relationship is corrected based on variations of the on-resistance in accordance with variations of the operating ambient temperature.

The second aspect of the present teachings has the feature that the resistance between the FET and ground, which resistance generates the overcurrent, is determined directly by using the threshold value, and it is possible to reliably protect the FET(s) and other circuit components from overcurrents in a manner similar to the first aspect of the present teachings. As a result, even if electric current (power) is supplied to a load from a high voltage DC power source such as 500V, one or more FETs can be used as the power switching device(s). In particular, the circuit configuration can be simplified because it is possible to perform the overcurrent protecting operation based on the drain-source voltage and the rate of increase of the drain-source voltage by using only the first overcurrent protection signal generating circuit.

In a modification of the first or the second aspect of the present teachings, the first overcurrent protection signal generating circuit preferably includes a timer which outputs a timer signal during a predetermined timer period when the drain-source voltage becomes larger than a first threshold value. Furthermore, when the drain-source voltage continues within the predetermined timer period to be larger than a second threshold value for a predetermined period (major overcurrent), which second threshold value is larger than the first threshold value (second threshold value>first threshold value), the first overcurrent protection signal is output. In addition, the number of times the timer signals are output is counted and, when the count number reaches a predetermined number (minor overcurrent), the first overcurrent protection signal is output. It is noted that the term "larger" may include "equal", i.e. the second threshold value may be larger than or equal to the first threshold voltage.

In this modification, the overcurrent protecting operation can be reliably performed when either a major overcurrent or a minor overcurrent flows.

In a different modification of the first aspect of the present teachings, the second overcurrent protection signal generating circuit preferably measures a time interval from the drain-source voltage becoming larger than a first threshold value until the drain-source voltage becomes larger than a third threshold value that is larger than the first threshold value (third threshold value>first threshold value), and sets a longer reference time interval based on the measured time interval. In addition, when the drain-source voltage becomes larger than a fourth threshold value that is larger than the third threshold value (fourth threshold value>third threshold value) from the drain-voltage becoming larger than the first threshold value until the reference time interval has lapsed, the second overcurrent protection signal is output. It is noted that the term "larger" may again include "equal" in a manner similar to the above explanation.

In this modification, a major overcurrent can be reliably prevented from flowing through the FET while preventing the FET from being turned off by an inrush current when the FET is turned on.

In case the second overcurrent protection signal generating circuit of this modification is used together with the first overcurrent protection signal generating circuit of the above mentioned modification, the fourth threshold value is preferably set to be less than the second threshold value.

In a different modification of the first or the second aspects of the present teachings, the drain-source voltage detecting circuit preferably has a first source follower circuit including a first P type MOSFET, a second source follower circuit including a second P type MOSFET, a threshold value setting circuit and a comparator.

The source of the first P type MOSFET is connected via a first resistor to an electrode of the load side of the FET and a common gate bias potential is supplied to the gate of the first P type MOSFET. The term "an electrode of the load side of the FET" means the electrode from among one of main electrodes (drain, source) of the FET of the side that is connected to the load (the side connected to the negative electrode of the DC power source).

The source of the second P type MOSFET is connected via a second resistor, which has a resistance equal to the resistance of the first resistor, to an electrode of the DC power source side of the FET and the common gate potential is supplied to the gate of the second P type MOSFET. The circuit is preferably designed such that the drain current of the second P type MOSFET is a current having a value corresponding to the value obtained by subtracting the threshold value being used at that time from the drain-source voltage of the FET.

The threshold value setting circuit is configured to be able to vary the drain current of the second P type MOSFET by drawing a current, which varies according to an electric potential of the electrode of the DC power source side of the FET, from the source of the second P type MOSFET.

The comparator detects whether the drain current of the second P type MOSFET is larger than that of the first P type MOSFET.

In this modification, the drain-source voltage can be detected considering the rate of increase of the drain-source voltage. The drain-source voltage detecting circuit of this embodiment has an advantageous effect when used in the second aspect of the present teachings.

In a different modification of the first or the second aspects of the present teachings, an N type MOSFET is used as the FET. In addition, the drain-source voltage detection initiation circuit initiates the drain-source voltage detecting operation of the drain-source voltage detecting circuit when the gate potential of the N type MOSFET becomes larger than the drain potential of this MOSFET.

In the alternative, in a different modification of the first or the second aspects of the present teachings, a P type MOSFET is used as the FET. In addition, the drain-source voltage detection initiation circuit initiates the drain-source voltage detecting operation of the drain-source voltage detecting circuit when the gate potential of the P type MOSFET becomes smaller than the drain potential of this MOSFET.

In this modification, the overcurrent protection power supply apparatus can be configured by using one or more MOSFETs as the power switching device(s).

In a different modification of the first or the second aspects of the present teachings, a constant voltage circuit is provided that holds the voltage, which is supplied to the drain-source voltage detecting circuit and the drain-source voltage detection initiation circuit, at a lower constant value than the voltage of the DC power source.

In this modification, FET(s) rated for low voltage systems can be used even if a high voltage DC power source supplies the electric power to the load. As a result, the chip area for the FET(s) can be prevented from increasing when the circuit is converted into an IC.

By using the overcurrent protection power supply apparatus of the present teachings, electric current (power) can be supplied to a load from a high voltage DC power source via one or more FETs.

DETAILED DESCRIPTION OF THE INVENTION

At first, basic concepts of the overcurrent protection power supply apparatus of the present teachings will be discussed.

The overcurrent protection power supply apparatus of the present teachings performs overcurrent protection by detecting a current flowing through a FET, which is used as a power switching device, by detecting a drain-source voltage $V_{DS}$ ($V_{DS}=I_D \times R_{ON}$) of the FET from (using) a drain current $I_D$ of the FET and a resistance $R_{ON}$ of the FET, and by turning off the FET when the drain-source voltage $V_{DS}$ becomes larger than a threshold value.

However, when a ground fault (dead short) occurs, the current (ground current) reaches an extraordinarily large value (attained current value). In this case, if the overcurrent protecting operation is initiated after the drain-source voltage $V_{DS}$ has become larger than the threshold value, it is possible that the overcurrent protection will not be adequately performed.

It has been found that, when a ground fault occurs, there is a phenomenon in which the rate of increase (increase slope) of the drain-source voltage $V_{DS}$ of the FET becomes large before the current (ground current) becomes large. That is, the overcurrent protection can be rapidly performed by performing the detection and the overcurrent protecting operation when the rate of increase of the drain-source voltage $V_{DS}$ of the FET becomes large.

Thus, the overcurrent protection power supply apparatus of the present teachings performs the overcurrent protection by turning off the FET also when the rate of increase (increase slope) of the drain-source voltage $V_{DS}$ of the FET, which is used as the power switching device, becomes large.

Embodiments of the present teachings will now be described in detail with reference to the drawings.

It is noted that the first to fourth embodiments described below belong to a first type of overcurrent protection power supply apparatus of the present teachings and the fifth embodiment belongs to a second type of overcurrent protection power supply apparatus of the present teachings.

The overcurrent protection power supply apparatus of the first type performs the overcurrent protection by detecting the drain-source voltage $V_{DS}$ becoming large based on the drain-source voltage $V_{DS}$ or alternatively, the rate of increase of the drain-source voltage $V_{DS}$ becoming large based on the rate of increase of the drain-source voltage $V_{DS}$.

In addition, the overcurrent protection power supply apparatus of the second type performs the overcurrent protection, based only on the drain-source voltage $V_{DS}$, by detecting the drain-source voltage $V_{DS}$ becoming large or alternatively, the rate of increase of the drain-source voltage $V_{DS}$ becoming large.

Furthermore, unless otherwise specified, the terms "voltage" and "current" respectively mean "magnitude (value) of the voltage" and "magnitude (value) of the current".

[First Embodiment]

Figure 1:
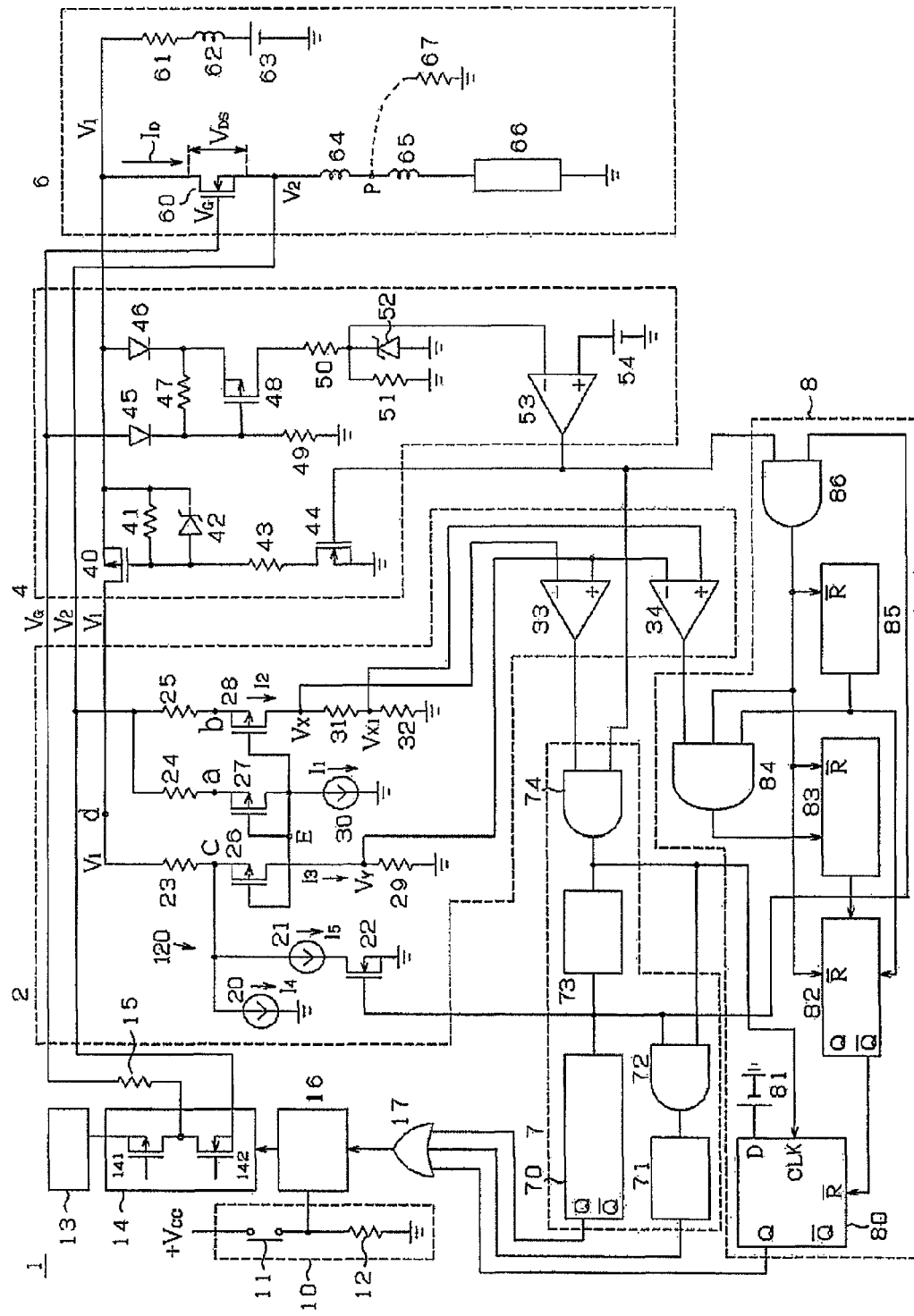
FIG. 1 is a circuit diagram showing a first embodiment of the overcurrent protection power supply apparatus of the present teachings.

FIG. 1 is a circuit diagram showing a first embodiment of the present teachings. The overcurrent protection power supply apparatus 1 of the first embodiment comprises a drain-source voltage detecting circuit 2, a drain-source voltage detection initiation circuit 4, an electric power supply circuit 6, a first overcurrent protection signal generating circuit 7, a second overcurrent protection signal generating circuit 8, a switch circuit 10, a charge pump circuit 13, a drive circuit 14, a control circuit 16 and an OR circuit 17.

(1) Electric Power Supply Circuit 6

The electric power supply circuit 6 is a circuit that supplies electric power to a load 66 and has a DC power source 63 and an N type MOSFET 60 (hereinafter referred to as the "FET 60"), which is the power switching device. Resistance 61 and inductances 62, 64 and 65 are the resistance and the inductances, respectively, of the wiring.

It is noted that point P in the wiring, which connects the FET 60 with the load 66, represents an example of a place where a ground fault (dead short) has occurred. When a ground fault occurs, current (ground current) flows from the DC power source 63 to ground via the FET 60 and the ground resistance 67. Since the ground resistance 67 is very small, the ground current becomes very large.

The switch circuit 10 has a switch 11 and a resistor 12 which are connected in series between a voltage source $V_{CC}$ and ground (earth).

The drive circuit 14 has a P type MOSFET 141 (hereinafter referred to as the "FET 141") and an N type MOSFET 142 (hereinafter referred to as the "FET 142"), the drains of which are connected to each other. A voltage from the charge pump circuit 13 is supplied to the source of the FET 141. The drain of the FET 141 is connected to the gate of the FET 60 of the electric power supply circuit 6 via a wire having a resistance 15. The wire connected to the gate of the FET 60 is called the "$V_G$ line". The source of the FET 142 is connected to the source of the FET 60. The wire connected to the source of the FET 60 is called the "$V_2$ line".

When the switch 11 is turned on, the voltage $V_{CC}$ at the point where the switch 11 and the resistor 12 are connected to each other is input to the control circuit 16 as a signal indicating initiation of supplying electric power to (powering up) the load 66. When the switch 11 is turned on, the control circuit 16 turns on the FET 141 of the drive circuit 14 and simultaneously turns off the FET 142, so that the voltage from the charge pump circuit 13 is supplied to the gate of the FET 60 via the resistance 15. As a result, the FET 60 turns on, so that the power supply from the DC power source 63 to the load 66 is initiated.

(2) Drain-Source Voltage Detection Initiation Circuit 4

If $R_{ON}$ represents the on-resistance of the FET 60, $I_D$ represents the drain current of the FET 60 and $V_{DS}$ represents the drain-source voltage of the FET 60, and when the FET 60 is operating in the ohmic region, equation (1) is established.

$$I_D \times R_{ON} = V_{DS} \quad (1)$$

Since $I_D$ is proportional to $V_{DS}$ in the operating region where $R_{ON}$ is constant, $I_D$ can be detected by detecting $V_{DS}$, and the rate of increase of $I_D$ can be detected by detecting the rate of increase of $V_{DS}$.

$R_{ON}$ is constant when the FET 60 is in the on-state and stable. Thus, in this state, the occurrence of a ground fault can be detected by detecting the rate of increase of $I_D$ based on the rate of increase of $V_{DS}$.

However, in a transient period (about 1 μs) after the switch 11 is turned on during which the FET 60 transitions from the off-state to the on-state, the FET 60 operates in the pinch-off region. Therefore, during this transient period, equation (1) does not hold. That is, the rate of increase of $I_D$ cannot be accurately detected based on the rate of increase of $V_{DS}$. If the FET 60 is configured to be turned off based on the rate of increase of $V_{DS}$ in this operating region, there is a possibility of a malfunction in the normal state.

It is noted that, when the FET 60 transitions from the off-state to the on-state, initially the drain-source voltage $V_{DS}$ of the FET 60 decreases rapidly and thereafter changes to increasing.

However, in order to prevent such a malfunction, if the start timing of the $V_{DS}$ detection is delayed too much when the FET 60 turns on, the overcurrent protection can not be adequately performed in case a ground fault has occurred before the FET 60 turns on. For example, in case the ground fault occurs while using a 500V DC power source 63, the rate of increase of the current (ground current) reaches 150 A/μs.

Therefore, in order to reliably perform the overcurrent protection, it is necessary to initiate the detection of $V_{DS}$ as soon as possible taking into account the transient period when equation (1) does not hold.

Herein, $V_1$, $V_G$ and $V_2$ are defined as follows.

$V_1$—the voltage of the main electrode (drain in FIG. 1), from among the main electrodes of the FET 60, that is connected to the DC power source 63 (the positive electrode of the DC power source 63) (hereinafter referred to as the "drain voltage $V_1$").

$V_G$—the gate voltage of the FET 60 (hereinafter referred to as the "gate voltage $V_G$").

$V_2$—the voltage of the main electrode (the source in FIG. 1), from among the main electrodes of the FET 60, that is connected the load 66 (the negative electrode of the DC power source 63 via the load 66) (hereinafter referred to as the "source voltage $V_2$").

It is noted that $[V_{DS}=V_1-V_2]$.

In addition, in this embodiment, the voltage of the charge pump circuit 13 is set to $[V_1+15V]$.

During the off-state of the FET 60, $V_1 \gg V_G$ ($=V_2$). Furthermore, when the switch 11 is turned on, the voltage from the charge pump circuit 13 is supplied to the gate of the FET 60, and thereby $V_G$ increases. That is, at the time of the supply of power, the gate voltage $V_G$ of the FET 60 increases from a lower value than the drain voltage $V_1$, then exceeds the drain voltage $V_1$, and eventually reaches $[V_1+15V]$.

At the timing just after the gate voltage $V_G$ becomes larger than the drain voltage $V_1$ (the timing when $[V_G>V_1]$), the states of the on-resistance $R_{ON}$, the drain current $I_D$ and the drain-source voltage $V_{DS}$ of the FET 60 are as follows.

(State of $R_{ON}$)

At the timing just after $V_G$ becomes greater than $V_1$, the gate-source voltage ($V_G-V_2$) of the FET 60 is slightly larger than the threshold voltage (from 3 to 4V) of the FET 60. However, at this time point, the on-resistance $R_{ON}$ (resistance value) is not a stable value, but is in the process of decreasing towards the saturated value. It is necessary that ($V_G-V_2$) becomes 10V or greater in order for the on-resistance $R_{ON}$ to reach the saturated value. The rate of decrease of the on-resistance $R_{ON}$ is about −36%/μs.

It is noted that, since the on-resistance $R_{ON}$ is not a stable value, the drain-source voltage $V_{DS}$ of the FET 60 is not proportional to the drain current $I_D$.

(State of $I_D$)

At the timing just after $V_G$ becomes greater than $V_1$, the drain current $I_D$ of the FET 60 has not reached a final attainment value (saturated value) yet, but is in the process of increasing. The rate of increase of the drain current $I_D$ is about +166%/μs. The rate of increase of the drain current $I_D$ becomes a maximum immediately after $V_G$ becomes greater than $V_1$.

(State of $V_{DS}$)

The drain-source voltage $V_{DS}$ is expressed by $[V_{DS}=R_{ON} \times I_D]$. As was mentioned above, at the timing just after $V_G$ becomes greater than $V_1$, $R_{ON}$ is in the process of decreasing and $I_D$ is in the process of increasing at a rate greater than the rate of decrease of $R_{ON}$. In this case, since the rate of decrease of $R_{ON}$ is offset by the rate of increase of $I_D$, $V_{DS}$, which is the product of $R_{ON}$ and $I_D$, is in the process of increasing.

As was discussed above, at the timing after $V_G$ becomes greater than $V_1$, the drain-source voltage $V_{DS}$ is definitely in the process of increasing.

Therefore, in this embodiment, the drain-source voltage detection initiation circuit 4 is provided and is configured such that, when the FET 60 is turned on, the detection of the drain-source voltage $V_{DS}$ is initiated at the time when the gate voltage $V_G$ of the FET 60 becomes larger than the drain voltage $V_1$ of the FET 60 (the timing $[V_G>V_1]$). Furthermore, when the rate of increase of $V_{DS}$ becomes larger than a threshold value, the overcurrent protecting operation is performed. It is noted that this threshold value is set to be smaller than the rate of increase of $V_{DS}$ in case an overcurrent is flowing (a current to be cut off) and to be larger than the rate of increase of $V_{DS}$ in case a normal current is flowing.

Thus, in the transient period in which the FET 60 transitions from the off-state to the on-state, the time until the detection initiation of the overcurrent (the detection initiation of $V_{DS}$) can be shortened, and thereby the overcurrent protection can be reliably performed.

The circuit configuration of the drain-source voltage detection initiation circuit 4 will now be explained.

The drain of a P type MOSFET 40 (hereinafter referred to as "FET 40") is connected to point d of the drain-source voltage detecting circuit 2. The source of the FET 40 is connected via a wire to the electrode (drain), from among the main electrodes of the FET 60, that is connected to the positive electrode of the DC power source 63. The wire connected to the source of the FET 40 is referred to as the "$V_1$ line". The gate of the FET 40 is connected to the source of the FET 40 via a parallel circuit in which a resistor 41 and a Zener diode 42 are connected in parallel and is connected to ground via a resistor 43 and an N type MOSFET 44 (hereinafter referred to as the "FET 44"). The anode of the Zener diode 42 is connected to the gate of the FET 40.

The anode of a diode 45 is connected to the $V_G$ line and the cathode of the diode 45 is connected to the gate of a P type MOSFET 48 (hereinafter referred to as "FET 48") and is connected to ground via a resistor 49. The anode of a diode 46 is connected to the $V_1$ line and the cathode of the diode 46 is connected to the source of the FET 48. The cathode of the diode 45 and the cathode of the diode 46 are connected via a resistor 47.

The drain of the FET 48 is connected to ground via a resistor 50 and via a parallel circuit, in which a resistor 51 and a Zener diode 52 are connected in parallel, and is connected to an inverting input terminal of a comparator 53 via the resistor 50. The non-inverting input terminal of the comparator 53 is connected to a DC power source 54. The output terminal of the comparator 53 is connected to the gate of the FET 44, to the first overcurrent protection signal generating circuit 7 and to the second overcurrent protection signal generating circuit 8.

The operation of the drain-source voltage detection initiation circuit 4 will now be explained.

(The State of $V_G < V_1$)

In this state, the diode 45 is off, and a current flows from the diode 46 to the resistor 47 and the resistor 49. As a result, the FET 48 turns on, and a Zener voltage generated between the two ends of the Zener diode 52 is supplied to the inverting input terminal of the comparator 53. Since the Zener voltage is set to be larger than the voltage of the DC power source 54, the output of the comparator 53 becomes an L level (hereinafter referred to simply as "L"). Since the output of the comparator 53 is L, the FETs 44 and 40 are in the off-state.

(The State of $V_G > V_1$)

In this state, the diode 45 is on and the voltage $V_G$ from the $V_G$ line is supplied to the gate of the FET 48. As a result, the FET 48 turns off. When the FET 48 turns off, the voltage between the two ends of the Zener diode 52 becomes zero, and the output of the comparator 53 becomes an H level (hereinafter referred to simply as "H").

When the output of the comparator 53 becomes H, both FETs 40 and 44 turn on. When the FET 40 turns on, the voltage $V_1$ from the $V_1$ line is supplied to point d of the drain-source voltage detecting circuit 2, and thereby the drain-source voltage detecting circuit 2 starts to operate.

(3) Drain-Source Voltage Detecting Circuit 2

The drain-source voltage detecting circuit 2 detects whether the drain-source voltage $V_{DS}$ of the FET 60 is larger than the threshold value. That is, it outputs the result of the comparison of $V_{DS}$ with the threshold value.

The circuit configuration of the drain-source voltage detecting circuit 2 will now be explained.

The $V_1$ line is connected to ground via a resistor 23, the source and the drain of a P type MOSFET 26 (hereinafter referred to as "FET 26") and a resistor 29. Connecting point c of the resistor 23 and the FET 26 is connected to ground via a detection voltage reducing circuit 120.

The detection voltage reducing circuit 120 comprises a series circuit, in which a constant current source (constant current circuit) 21 providing a constant current $I_5$ and an N type MOSFET 22 (hereinafter referred to as "FET 22") are connected in series, as well as a constant current source (constant current circuit) 20 providing a constant current $I_4$ that is connected in parallel with the series circuit. The gate of the FET 22 is connected to the first overcurrent protection signal generating circuit 7.

Voltage $V_Y$ is generated across the two ends of the resistor 29 by a current $I_3$ flowing through the FET 26. The voltage $V_Y$ varies according to the drain-source voltage $V_{DS}$ of the FET 60. Since the drain-source voltage $V_{DS}$ of the FET 60 varies according to the drain current $I_D$ of the FET 60, the voltage $V_Y$ varies according to the drain current $I_D$ of the FET 60. The voltage $V_Y$ is used as a detection voltage that corresponds to the drain-source voltage $V_{DS}$ of the FET 60.

In this embodiment, the drain of the FET 60 is a representative example of "the electrode of the DC power source side of the FET" of the present teachings. Further, the detection voltage $V_Y$ is a representative example of the "detection signal (detection voltage) corresponding to the drain-source voltage" of the present teachings. Further, the "second source follower circuit" is preferably formed by the resistor 23, the FET 26 and the resistor 29. The "detection signal generating circuit that generates a detection signal corresponding to the drain-source voltage" is preferably formed by the second source follower circuit and the detection voltage reducing circuit 120.

The $V_2$ line is connected to ground via a resistor 24, the source and the drain of a P type MOSFET 27 (hereinafter referred to as "FET 27") and a constant current source 30 providing a constant current $I_1$. The gate of the FET 27 is connected to the drain of the FET 27.

In addition, the $V_2$ line is connected to ground via a resistor 25, the source and the drain of a P type MOSFET 28 (hereinafter referred to as "FET 28"), a resistor 31 and a resistor 32. Voltage $V_X$ generated across the two ends of a series circuit, in which a resistors 31 and 32 are connected in series, by a current $I_2$ flowing through the FET 28 and voltage $V_{X1}$ generated across the two ends of the resistor 32 are used as reference voltages that are compared to the voltage $V_Y$.

In this embodiment, the source of the FET 60 is a representative example of "the electrode of the load side of the FET" of the present teachings. The reference voltages $V_X$ and $V_{X1}$ correspond to "(a) reference signal(s) (reference voltage(s))" of the present teachings. The "first source follower circuit" is preferably formed by the resistor 25, the FET 28, the resistor 31 and the resistor 32. The first source follower circuit is a representative example of the "reference signal generating circuit that generates the reference signal" of the present teachings.

The FETs 26, 27 and 28 are P type MOSFETs having the same properties and each of the gates is connected to a common connecting point E.

Resistance $R_{29}$ of the resistor 29, resistance $R_{31}$ of the resistor 31 and resistance $R_{32}$ of the resistor 32 are set so as to satisfy $[R_{29} = R_{31} + R_{32}]$.

Furthermore, resistance $R_{23}$ of the resistor 23, resistance $R_{24}$ of the resistor 24 and resistance $R_{25}$ of the resistor 25 are set to the same value ($R_{23} = R_{24} = R_{25}$).

When a current is not being drawn from connecting point c to the constant current sources 20 and 21 ($I_4 = 0$, $I_5 = 0$) and in case $[V_Y = V_X]$ is satisfied, $[I_2 = I_3]$ is satisfied because $[R_{29} = R_{31} + R_{32}]$. Furthermore, since the FETs 26 and 28 have the same properties, the gate potentials $V_E$ are the same. Since $[R_{23} = R_{25}]$, $[V_1 = V_2]$ is satisfied. That is, the drain-source voltage $V_{DS}$ of the FET 60 is zero ($V_{DS} = 0$).

When a current is drawn from connecting point c to the constant current sources 20 and 21 ($I_4 \neq 0$, $I_5 \neq 0$) and in case $[V_Y = V_X]$ is satisfied, $[V_1 > V_2]$ is satisfied. That is, $V_{DS}$ becomes a non-zero positive value.

When the drawn current is increased by the detection voltage reducing circuit 120, the current $I_3$ decreases, and thereby the detection voltage $V_Y$ also decreases. That is, the detection voltage $V_Y$ decreases due to the increase of the drawn current. In other words, the reference voltages $V_X$ and $V_{X1}$ relatively increase.

A comparator 33 compares the detection voltage $V_Y$ to the reference voltage (reference signal) $V_X$. $V_X$ is supplied to the inverting input terminal of the comparator 33 and $V_Y$ is supplied to the non-inverting input terminal. The output terminal of the comparator 33 is connected to the first overcurrent protection signal generating circuit 7 (AND circuit 74). The output of the comparator 33 is L when $[V_Y < V_X]$ is satisfied, and is H when $[V_Y > V_X]$ is satisfied.

A comparator 34 compares the detection voltage $V_Y$ with the reference voltage (reference signal) $V_{X1}$. $V_Y$ is supplied to an inverting input terminal of the comparator 34 and $V_{X1}$ is supplied to a non-inverting input terminal. An output terminal of the comparator 34 is connected to the second overcurrent protection signal generating circuit 8 (AND circuit 84). The output of the comparator 34 is H when $[V_Y<V_{X1}]$ is satisfied, and L when $[V_Y>V_{X1}]$ is satisfied.

The operation of the drain-source voltage detecting circuit 2 will now be explained.

($[V_G<V_1]$ is Satisfied: FET 40 is Off)

The source voltage $V_2$ increases by the FET 60 being turned on, and the current $I_2$ flows to the first source follower circuit connected to the $V_2$ line. As a result, the reference voltages $V_X$ and $V_{X1}$ become positive values.

On the other hand, since the FET 40 is in the off-state, the drain voltage $V_1$ is not supplied to the second source follower circuit, so that the current $I_3$ is zero. As a result, the detection voltage $V_Y$ is zero.

Consequently, $[V_X>V_Y]$ is satisfied, and the output of the comparator 33 is L.

($[V_G>V_1]$ is Satisfied: FET 40 is On)

When the gate voltage $V_G$ increases and $[V_G>V_1]$ is satisfied, the output of the comparator 53 becomes H, and the FETs 44 and 40 turn on. As a result, the drain voltage $V_1$ from the $V_1$ line is supplied to the second source follower circuit, and the current $I_3$ flows. By setting the current $I_4$ such that $V_Y$ is also small while $V_{DS}$ is small, $[V_X>V_Y]$ is satisfied. As a result, while $V_{DS}$ is small, the output of the comparator 33 is L. When the output of the comparator 33 is L, the FET 22 is in the off-state.

($I_D$ is within a Normal Range and Constantly Flows: FET 22 is Off)

When the drain current $I_D$ of the FET 60 is within a normal range and flows constantly, the output of the comparator 33 is L. While the output of the comparator 33 is L, the FET 22 is in the off-state.

(The Output of the Comparator 33 is H, while the FET 22 is in the Off-State)

When $V_Y$ ($V_{DS}$) increases and $[V_Y>V_X]$ is satisfied while the FET 22 is in off-state, the output of the comparator 33 is H. $V_{DSA}$ is the value of $V_{DS}$ at the time when the output of the comparator 33 becomes H and can be determined as follows. It is noted that $V_a$, $V_b$ and $V_c$ are respectively the voltages at points a, b and c shown in FIG. 1.

$I_2$ is expressed by equation (2).

$$I_2=(V_2-V_b)/R_{25} \quad (2)$$

Since $[R_{23}\times(I_3+I_4)=V_1-V_C]$ and $[V_1=V_2+V_{DS}]$ are established, $I_3$ is expressed by equation (3).

$$I_3=(V_2+V_{DS}-R_{23}\times I_4-V_c)/R_{23} \quad (3)$$

$V_X$ is expressed by equation (4).

$$V_X=(R_{31}+R_{32})\times I_2=(R_{31}+R_{32})\times(V_2-V_b)/R_{25} \quad (4)$$

$V_Y$ is expressed by equation (5).

$$V_Y=R_{29}\times I_3=R_{29}\times(V_2+V_{DS}-R_{23}\times I_4-V_c)/R_{23} \quad (5)$$

$V_{DS}$ at the time when $[V_Y=V_X]$ is satisfied is $V_{DSA}$, which is the value of $V_{DS}$ at the time when the output of the comparator 33 changes from L to H. Therefore, $V_{DSA}$ can be expressed by equation (6), which is derived from equation (4) that represents $V_X$ and equation (5) that represents $V_Y$.

$$V_{DSA}=R_{23}\times I_4 \quad (6)$$

It is understood from equation (4) that $V_X$ is a voltage that does not vary with $V_{DS}$.

It is understood from equation (5) that $V_Y$ is a voltage that varies according to $V_{DS}$. That is, when $V_{DS}$ is small, $V_Y$ is also small, so that $[V_Y<V_X]$ is satisfied. In addition, $V_Y$ increases with an increase of $V_{DS}$, then becomes $[V_Y=V_X]$, and then becomes $[V_Y>V_X]$. When $[V_Y>V_X]$ is satisfied, the output of the comparator 33 becomes H.

It is understood from equation (6) that $V_{DSA}$, which is the value of $V_{DS}$ at the time when the output of the comparator 33 becomes H while the FET 22 is in off-state, can be set arbitrarily by adjusting the current $I_4$ from the constant current source 20. Since the current $I_4$ from the constant current source 20 is precisely settable to a constant value, $V_{DSA}$ is also precisely settable to a constant value.

Although the details will be described later, the FET 22 turns on when the output of the comparator 33 becomes H.

(When the FET 22 is On)

When the FET 22 turns on and causes the current $I_5$ to flow, the current drawn from point c becomes $(I_4+I_5)$. $V_{DSB}$ is the value of $V_{DS}$ at the time when the output of the comparator 33 becomes H while the FET 22 is in on-state. Therefore, $V_{DSB}$ is expressed by equation (7), which is derived from equation (6) by replacing $I_4$ with $(I_4+I_5)$.

$$V_{DSB}=R_{23}\times(I_4+I_5) \quad (7)$$

Since $(I_4+I_5)$ is precisely settable to a constant value, $V_{DSB}$ is precisely settable to a constant value.

In addition, $V_{DSC}$ represents the value of $V_{DS}$ at the time when the output of the comparator 34 becomes L while the FET 22 is in on-state. Therefore, $V_{DSC}$ can be determined as follows.

$V_{X1}$ is expressed by equation (8).

$$V_{X1}=R_{32}\times I_2=R_{32}\times(V_2-V_b)/R_{25} \quad (8)$$

$V_Y$ is expressed by equation (9).

$$V_Y=R_{29}\times I_3=R_{29}\times\{V_2+V_{DSC}-R_{23}\times(I_4+I_5)-V_C\}/R_{23} \quad (9)$$

$V_{DS}$ at the time when $[V_{X1}=V_Y]$ is satisfied is defined as $V_{DSC}$, which is the value of $V_{DS}$ at the time when the output of the comparator 34 changes from H to L. Therefore, $V_{DSC}$ is expressed by equation (10), which is derived from equation (8) that represents $V_{X1}$ and equation (9) that represents $V_Y$.

$$V_{DSC}=\{(R_{32}-R_{29})\times(V_2-V_b)/R_{29}\}+R_{23}\times(I_4+I_5)+(V_c-V_b) \quad (10)$$

Since the threshold voltage of FETs 26 and 28 is $V_{th}$, and the on-resistance thereof is $R_{ON1}$, $(V_c-V_b)$ is expressed by equation (11).

$$(V_c-V_b)=R_{ON1}\times\{V_{DSC}-R_{23}\times(I_4+I_5)\}/(R_{ON1}+R_{25}) \quad (11)$$

Equation (12) is derived by substituting equation (11) into equation (10).

$$V_{DSC}=\{(R_{32}-R_{29})/R_{29}\}\times\{1+(R_{ON1}/R_{25})\}\times(V_2-V_b)+R_{23}(I_4+I_5) \quad (12)$$

As was mentioned above, since the circuit has been configured to satisfy $[R_{31}+R_{32}=R_{29}]$, $[R_{32}<R_{29}]$ is satisfied. Thus, the first term of equation (12) is negative. The second term of equation (12) is $V_{DSB}$ since it is the same as equation (7). That is, $V_{DSC}$ can be set to an arbitrary value by adjusting $(R_{32}-R_{29})$.

Since $V_{DSC}$ is smaller than $V_{DSB}$ by the first term, $[V_{DSC}<V_{DSB}]$ is satisfied. However, the fact that $V_{DSC}$ is less than $V_{DSB}$ can also be understood intuitively based on the circuit configuration. That is, it can be readily understood from the circuit configuration that $[V_{X1}<V_X]$. In addition, because $V_{DS}$ at the time when $V_Y$ exceeds $V_{X1}$ is defined as $V_{DSC}$, and $V_{DS}$ at the time when $V_Y$ exceeds $V_X$ is defined as $V_{DSB}$, it can be readily understood that $[V_{DSC}<V_{DSB}]$.

It is noted that, since equation (12) includes $R_{ON1}$ which cannot be always constant, $V_{DSC}$ cannot be precisely set to a constant value.

$V_{DSA}$, $V_{DSB}$, and $V_{DSC}$ are summarized as follows.

The magnitudes thereof have the relationship $[V_{DSA}<V_{DSC}<V_{DSB}]$.

$V_{DSA}$—is the value of $V_{DS}$ at the time when the output of the comparator 33 becomes H while the FET 22 is in off-state.

$V_{DSB}$—is the value of $V_{DS}$ at the time when the output of the comparator 33 becomes H while the FET 22 is in on-state.

$V_{DSC}$—is the value of $V_{DS}$ at the time when the output of the comparator 34 becomes L while the FET 22 is in on-state.

It is noted that $V_{DSA}$, $V_{DSB}$ and $V_{DSC}$ are representative examples of "threshold values" of the present teachings.

(4) First Overcurrent Detecting Signal Generating Circuit 7

The first overcurrent detecting signal generating circuit 7 generates an overcurrent protection signal (first overcurrent protection signal) when the drain-source voltage $V_{DS}$ of the FET 60 becomes larger than a threshold value (when the detection voltage becomes larger than the reference voltage).

The outputs of the comparators 53 and 33 are input to the AND circuit 74. The output of the AND circuit 74 is input to both a timer 73 and an AND circuit 72, and is input to a D type flip-flop 80 of the second overcurrent protection signal generating circuit 8.

The output of the timer 73 is input to both the AND circuit 72 and a counter 70, and is input to the gate of the FET 22 of the drain-source voltage detecting circuit 2 and to an AND circuit 86 of the second overcurrent protection signal generating circuit 8.

The Q output of the counter 70 is input to the OR circuit 17. The output of the AND circuit 72 is input to the OR circuit 17 via a digital filter 71.

The first overcurrent protection signal generating circuit 7 operates as follows.

(When $I_D$ is Normal)

When the FET 60 turns on and $[V_G>V_1]$ is satisfied, the output of the comparator 53 becomes H, and the FETs 40 and 44 turn on. When the FET 40 turns on, the drain voltage $V_1$ materializes at point d and $V_Y$ is generated by the flow of $I_3$.

When a normal current is flowing, $V_{DS}$ of the FET 60 is small; furthermore, $V_Y$ is smaller than $V_X$ $[V_X>V_Y]$. As a result, the output of the comparator 33 is L. Therefore, the output of the AND circuit 74 and the output of the timer 73 are L, and the FET 22 remains off. This state is referred to as the "I-mode".

(When an Overcurrent Flows)

When $[V_X<V_Y]$ is satisfied due to an increase of $I_D$ ($V_{DS}$), the output of the comparator 33 becomes H. As a result, both inputs of the AND circuit 74 (the outputs of the comparators 33 and 53) become H and the output of the AND circuit 74 becomes H.

When the output of the AND circuit 74 becomes H, the output of the timer 73 becomes H during the preset timer period $T_S$. It is noted that, if the output of the AND circuit 74 does not become H again within the preset timer period $T_S$, the output of the timer 73 returns to L.

When the output of the timer 73 becomes H, the FET 22 turns on and $I_5$ starts to flow. This state is referred to as the "T-mode".

When $I_5$ starts to flow, the current drawn from point c increases, $I_3$ decreases by that amount and the detection voltage $V_Y$ is pulled down (decreased). In other words, the reference voltage $V_X$ is pulled up (increased). As a result, $[V_X>V_Y]$ is satisfied and the output of the comparator 33 returns to L.

(In Case of a Minor Overcurrent)

When an overcurrent flows in the T-mode, $V_Y$ is pulled down with the decrease of $I_3$, and $[V_Y<V_X]$ is satisfied. Then, in case it is an overcurrent, in which $V_Y$ does not increase to satisfy $[V_X<V_Y]$ i.e. in case a minor overcurrent flows, after entering the T-mode ($V_Y$ is pulled down) the state of $[V_X>V_Y]$ is maintained during the preset timer period $T_S$. Then, the output of the timer 73 returns to L, and the FET 22 turns off. When the FET 22 turns off, $I_5$ becomes zero, and the pulling down of $V_Y$ (the pulling up of $V_X$) is stopped. That is, it becomes the "I-mode".

When $[V_Y>V_X]$ is satisfied in the state of the "I-mode", it becomes the "T-mode" again. While the minor overcurrent continues to flow, the switching back-and-forth of the "I-mode" and the "T-mode" is repeated.

In case the period of time that the overcurrent flows is short (for example, only 1 or 2 repetitions), it is not necessary to perform the overcurrent protecting operation, but, in the case of many repetitions, it is necessary to perform the overcurrent protecting operation. For this reason, the counter 70 is provided.

The counter 70 increments a count value each time the output of the timer 73 becomes H (each time the T-mode occurs).

When the count value (count number) of the counter 70 reaches a predetermined value (predetermined number) N, the output terminal Q of the counter 70 becomes H. The output H from the output terminal Q of the counter 70 is input to the control circuit 16 via the OR circuit 17. The control circuit 16 performs an overcurrent protecting operation and turns off the FET 60 when the output of the OR circuit 17 becomes H. It is noted that the output terminal Q of the counter 70 becomes H when the count value (count number) reaches a preset value (preset number) N within a predetermined period.

The output H from the output terminal Q of the counter 70 is a representative example of "a first overcurrent protection signal" of the present teachings.

It is noted that, in case the detection of the minor overcurrent occurs N times in succession in the interval of the preset timer period $T_S$, the FET 60 turns off after the lapse of a period $[T_S \times N]$. This period $[T_S \times N]$ is preferred to be shorter than 1 second.

As mentioned above, when the number of times that the minor overcurrent is detected reaches the predetermined number, the FET 60 is turned off, and the overcurrent protecting operation is performed.

(In Case of a Major Overcurrent)

In case a major overcurrent flows, $V_{DS}$ continues to increase after entering the T-mode, and the pulled down detection voltage $V_Y$ immediately increases. In addition, $V_{DS}$ (pulled down $V_{DS}$) reaches $V_{DSB}$ before the preset timer period $T_S$ lapses, $[V_X<V_Y]$ is satisfied and the output of the comparator 33 becomes H. As a result, the output of the AND circuit 74 becomes H. At the time when the output of the AND circuit 74 becomes H, it is within the preset timer period $T_S$; because the output of the timer 73 is maintained at H, the output of an AND circuit 72 becomes H.

The output H from the AND circuit 72 is input to the digital filter 71. When the output H of the AND circuit 72 is maintained for a predetermined period, the output of the digital filter 71 becomes H. The output H from the digital filter 71 is input to the control circuit 16 via the OR circuit 17. When the output of the OR circuit 17 becomes H, the control circuit 16 performs the overcurrent protecting operation and turns off the FET 60.

It is noted that the digital filer 71 prevents the FET 60 from turning off when the output of the AND circuit 72 becomes H for only a short time due to noise, etc.; that is, it prevents erroneous interruptions of the FET 60 due to noise.

(5) Second Overcurrent Protection Signal Generating Circuit 8

The second overcurrent protection signal generating circuit 8 generates an overcurrent protection signal (second overcurrent protection signal) when the rate of increase of the drain-source voltage $V_{DS}$ of the FET 60 becomes larger than a threshold value.

The output of the comparator 53 of the drain-source voltage detection initiation circuit 4 and the output of the timer 73 of the first overcurrent protection signal generating circuit 7 are input to the AND circuit 86. When the output of the timer 73 is L ("I mode"), the output of the AND circuit 86 is L, and a clock circuit 85 and counters 82 and 83 are reset. That is, the second overcurrent protection signal generating circuit 8 operates when the output of the timer 73 is H ("T mode").

The outputs of the comparator 34, the AND circuit 86 and the clock circuit 85 are input to an AND circuit 84. The output of the AND circuit 84 is input to a count input terminal of the counter 83. The output of the clock circuit 85 is also input to a count input terminal of the counter 82.

The output of the counter 83 is input to a set input terminal of the counter 82. The Q-bar output terminal of the counter 82 is connected to a reset terminal R-bar of the D type flip-flop 80. The output from the Q output terminal of the D type flip-flop 80 is input to the control circuit 16 via the OR circuit 17.

The counter 83 counts a clock signal input from the AND circuit 84. When the clock signal input is stopped, the counter 83 outputs a count value $N_{83}$ up to then (hereinafter, referred to as the "first count value") to the counter 82.

The counter 82 calculates a time period $T_{82}$ according to equation (13) by using the first count value $N_{83}$ input from the counter 83 and sets $T_{82}$ as the rate of increase detection time.

$$T_{82} = K \times N_{83} \times T_C + \alpha \quad (13)$$

It is noted that, K is a constant, $T_C$ is the clock interval of the clock circuit 85, α is a constant and ($N_{83} \times T_C$) is the time $T_{83}$ that was required to count up to $N_{83}$.

The rate of increase detection time $T_{82}$ is a representative example of "a reference time" of the present teachings.

The Q-bar output terminal of the counter 82 maintains H until the rate of increase detection time $T_{82}$ has elapsed since the counter 82 started to count, and becomes L after the rate of increase detection time $T_{82}$ has elapsed.

While H is being input to the reset terminal R-bar of the D type flip-flop 80 (within the rate of increase detection time $T_{82}$), if the input to the clock terminal CLK thereof increases from L to H, the Q output terminal of the D type flip-flop 80 becomes H. The H from the Q output terminal of the D type flip-flop 80 is input to the control circuit 16 via the OR circuit 17.

After the input to the reset terminal R-bar of the D type flip-flop 80 becomes L (after the lapse of the rate of increase detection time $T_{82}$), the Q output terminal does not become H even if the clock terminal CLK rises from L to H.

First, the rate of increase of $V_{DS}$ will be explained.

An overcurrent I is expressed by an exponential waveform that is shown in equation (14).

$$I = (V_B/R) \times \{1 - \exp(-R \times t/L)\} \quad (14)$$

It is noted that $V_B$ is the power supply voltage, R is the current path resistance (the resistance of the entire path via which the overcurrent flows), L is the current path inductance (the inductance of the entire path via which the overcurrent flows), and (L/R) is a time constant. ($V_B/R$) is the attained current value of the overcurrent and t is a time period.

If the ambient temperature of the FET 60 is the upper temperature limit of 125° C. when the overcurrent flows to the electric power supply circuit 6 shown in FIG. 1, and $R_{ON125}$ is the on-resistance of the FET 60 at that time, $V_{DS}$ is expressed by equation (15).

$$V_{DS} = R_{ON125} \times (V_B/R)\{1 - \exp(-R \times t/L)\} \quad (15)$$

Figure 6:
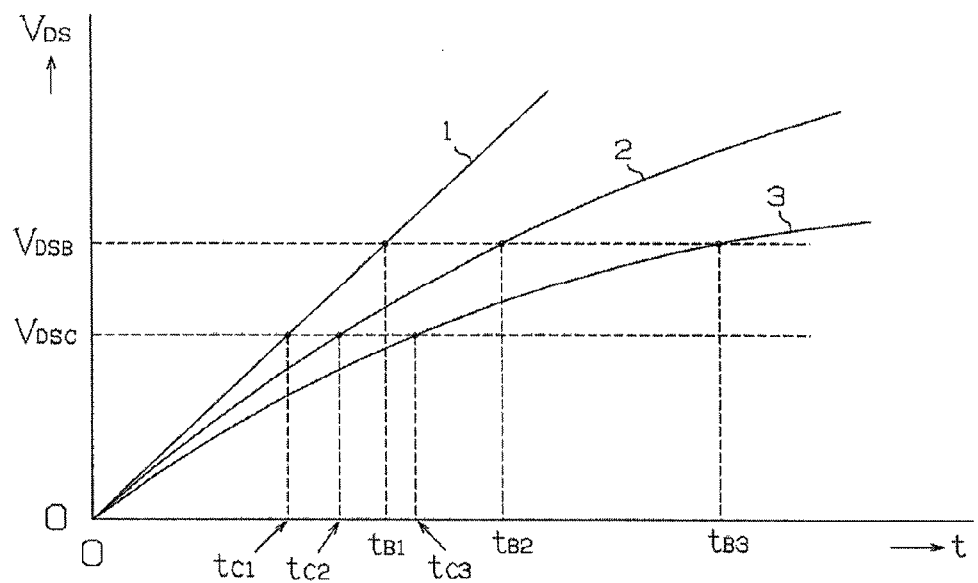
FIG. 6 is a chart showing $V_{DS}$ curves.

FIG. 6 is a chart showing $V_{DS}$ curves. It is noted that the horizontal axis of FIG. 6 denotes time and the vertical axis denotes $V_{DS}$. Numerals 1, 2 and 3 shown in FIG. 6 indicate three $V_{DS}$ curves. Curves 1, 2 and 3 are $V_{DS}$ obtained by multiplying the on-resistance $R_{ON125}$ of the FET 60 with the overcurrent I for the cases that the current path is the same but the values of the ground resistance differ.

Curve 1 is the case that the ground resistance is the smallest and curve 3 is the case that the ground resistance is the largest. It is understood from FIG. 6 that the smaller the ground resistance is, the more rapidly the curve rises.

$t_C(t_{C1}, t_{C2}, t_{C3})$ and $t_B(t_{B1}, t_{B2}, t_{B3})$ are times for curves 1, 2 and 3 to reach the threshold values $V_{DSC}$ and $V_{DSB}$, respectively.

The case that [$t = t_C$] and [$V_{DS} = V_{DSC}$] of equation (15) is expressed by equation (16).

$$V_{DSC} = R_{ON125} \times (V_B/R)\{1 - \exp(-R \times t_C/L)\} \quad (16)$$

$t_C$ is expressed by equation (17), which is derived from equation (16).

$$t_C = -(L/R) \times \ln\{1 - R \times V_{DSC}/(R_{ON125} \times V_B)\} \quad (17)$$

Similarly, $t_B$ when [$V_{DS} = V_{DSB}$] is expressed by equation (18).

$$t_B = -(L/R) \times \ln\{1 - R \times V_{DSB}/(R_{ON125} \times V_B)\} \quad (18)$$

Furthermore, ($t_B/t_C$) is expressed by equation (19), which is derived from equations (17) and (18). Because ($t_B/t_C$) is the ratio of the time $t_B$ for $V_{DS}$ to reach the threshold value $V_{DSB}$ to the time $t_C$ for $V_{DS}$ to reach the threshold value $V_{DSC}$, ($t_B/t_C$) will be referred to as the "ratio of $V_{DS}$ attainment times".

$$(t_B/t_C) = \ln\{1 - R \times V_{DSB}/(R_{ON125} \times V_B)\}/\ln\{1 - R \times V_{DSC}/(R_{ON125} \times V_B)\} \quad (19)$$

The voltage $V_B$ of the DC power source 63 of the electric power supply circuit 6 and $R_{ON125}$ of the FET 60 are fixed, and $V_{DSC}$ and $V_{DSB}$ are freely-set thresholds. Thus, it is understood from equation (19) that ($t_B/t_C$) is a function of only the resistance R of the current path, and does not depend on the inductance L of the current path.

The path resistance R is the sum of the circuit resistance up to the ground fault point P of FIG. 1 and the ground resistance $R_{67}$. In case the ground fault points are the same, the circuit resistance up to the ground fault point is the same. Thus, $(t_B/t_C)$ is a function of only the ground resistance $R_{67}$.

Figure 7:
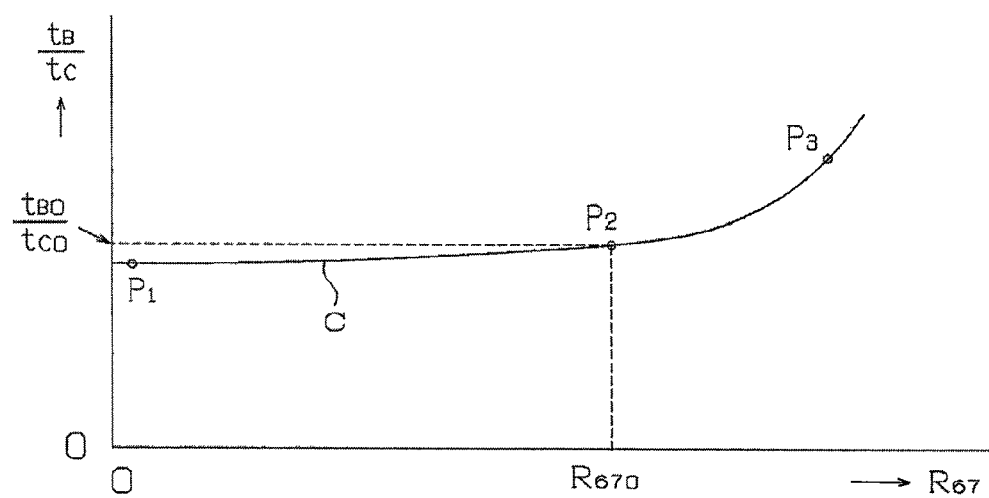
FIG. 7 is a chart showing a ratio of $V_{DS}$ attainment times.

FIG. 7 is a chart showing the ratio of $V_{DS}$ attainment times. It is noted that the horizontal axis of FIG. 7 denotes the ground resistance $R_{67}$ and the vertical axis denotes the ratio of $V_{DS}$ attainment times $(t_B/t_C)$. Points $P_1$, $P_2$ and $P_3$ on curve C of the ratio of $V_{DS}$ attainment times respectively indicate the ratio of $V_{DS}$ attainment times $(t_B/t_C)$ of curves 1, 2 and 3 shown in FIG. 6. For example, the ratio of $V_{DS}$ attainment times $(t_B/t_C)$ at point P1 is $(t_{B1}/t_{C1})$.

It is understood from FIG. 7 that the smaller the ground resistance $R_{67}$ is, the smaller $(t_B/t_C)$ is. On the other hand, it is understood from FIG. 6 that the smaller the ground resistance $R_{67}$ is, the larger the value (attained current value), which the overcurrent reaches, and the rate of increase of the overcurrent are. That is, when the overcurrent flows through the identical path, the smaller the ground resistance $R_{67}$ is or the larger the rate of increase of $V_{DS}$ is, the smaller the ratio of $V_{DS}$ attainment times $(t_B/t_C)$ is. Thus, it is understood that the severity (attained current value and rate of increase) of the overcurrent can be determined based on the ratio of $V_{DS}$ attainment times $(t_B/t_C)$.

Nevertheless, when the FET 60 turns on, an inrush current flows in the current path. This inrush current also becomes an exponential waveform. However, when the inrush current flows, the circuit must be configured to prevent the FET 60 from being turned off (shut off). Therefore, an attained current value is selected that is larger than the attained current value at which the inrush current flows, and $(t_B/t_C)$ at the time when an overcurrent, which reaches the selected current attainment value, flows is set as the threshold value $(t_{B0}/t_{C0})$ for the overcurrent protection. As a result, the FET 60 can be prevented from being turned off incorrectly when the inrush current flows.

If $R_0$ represents the resistance R of the current path (ground resistance $R_{670}$), $t_{B0}$ represents $t_B$ and $t_{C0}$ represents $t_C$ at the time when the threshold value $(t_{B0}/t_{C0})$ is set, the threshold value $(t_{B0}/t_{C0})$ is expressed by equation (20).

$$(t_{B0}/t_{C0}) = \ln\{1 - R_0 \times V_{DSB}/(R_{ON125} \times V_B)\}/\ln\{1 - R_0 \times V_{DSC}/(R_{ON125} \times V_B)\} \quad (20)$$

In FIG. 7, point $P_2$, i.e. $(t_{B2}/t_{C2})$ of curve 2 shown in FIG. 6, is set as the threshold value $(t_{B0}/t_{C0})$.

In this case, when $(t_B/t_C)$ is smaller than $(t_{B0}/t_{C0})$ ($[(t_B/t_C) < (t_{B0}/t_{C0})]$), for example, at point P1, the overcurrent protection is performed; when $(t_B/t_C)$ is larger than $(t_{B0}/t_{C0})$, for example, at point P3, the overcurrent protection is not performed.

In the above, it is presumed that the FET 60 is operating at its upper ambient temperature limit of 125° C. However, when the FET 60 is operating at an ambient temperature lower than its upper ambient temperature limit of 125° C., the on-resistance $R_{ON}$ of the FET 60 at that ambient temperature is smaller than $R_{ON125}$. In this case, if $R_0$ is the same, the threshold value $(t_{B0}/t_{C0})$, which is derived from equation (20) by replacing $R_{ON125}$ with $R_{ON}$, is larger than the threshold value, which is derived by using $R_{ON125}$. Therefore, if the ambient temperature varies, a threshold value obtained from equation (20) cannot be used as is.

Herein, if the ratio $(R/R_{ON})$ of the path resistance R to the on-resistance Ron of the FET 60 at an arbitrary ambient temperature is equal to $(R_0/R_{ON125})$, $(t_{B0}/t_{C0})$ is a constant value that does not depend on the ambient temperature. That is, for an on-resistance Ron at an arbitrary ambient temperature that is lower than the upper ambient temperature limit of 125° C., $R/R_0 = R_{ON}/R_{ON125}$ is satisfied, i.e. an overcurrent of a path resistance R that satisfies $[R = R_0 \times R_{ON}/R_{ON125}]$ is selected and equation (20) can be derived from the $V_{DS}$ curve obtained by multiplying the selected overcurrent by Ron.

This means that the attained current value of the overcurrent based on the threshold value varies with the ambient temperature; the lower limit of the overcurrent that can be protected (prevented) based on the rate of increase of $V_{DS}$ is a minimum when the ambient temperature of the FET 60 is at the upper ambient temperature limit of 125° C. and it becomes larger with decreases from 125° C. If this condition concerning the ambient temperature is satisfied, $(t_{B0}/t_{C0})$ is a fixed value independent of the ambient temperature and it can be used as the threshold value to detect the rate of increase of $V_{DS}$.

Since the temperature coefficient of $R_{ON}$ of an N type MOSFET is normally about 5000 ppm/degree, $R_{ON}$ at an ambient temperature of 25° C. is (1/1.5) of $R_{ON125}$. Therefore, in case the ambient temperature is 25° C., the lower limit of the overcurrent, which can be protected by detecting the rate of increase of $V_{DS}$, becomes a magnitude (current attainment value) that is 1.5 times greater than at 125° C.

Overcurrents that cannot be protected (prevented) by detecting the rate of increase of $V_{DS}$ must be protected (prevented) by detecting $V_{DS}$(magnitude). Therefore, the maximum magnitude of the overcurrent that will be protected (prevented) by detecting $V_{DS}$(magnitude) becomes larger as the ambient temperature decreases, and the amount of temperature increase of the FET 60 (=channel temperature of the FET 60 minus the ambient temperature) at the time the FET 60 is turned (shut) off increases. However, this amount of the temperature increase of the FET 60 is offset by the decrease of the ambient temperature. Thus, the threshold $(t_{B0}/t_{C0})$ can be so set so that it does not exceed the attained value of the channel temperature of the FET 60 when the FET 60 is turned off by detecting the magnitude of $V_{DS}$ at the upper ambient temperature limit of 125° C.

$t_B$ and $t_C$ of the ratio of $V_{DS}$ attainment times $(t_B/t_C)$ are time intervals which are measured from a start point (t=0) at which a current begins to flow (current begins to increase). In this embodiment, the time point at which $[V_G > V_1]$ is satisfied is used as the start point (t=0).

Therefore, when the overcurrent is detected from the rate of increase of $V_{DS}$, first the time $t_C$ until the lower threshold value $V_{DSC}$ is reached is measured, and time interval $T_{82}$ is set according to equation (21) based upon the measured time $t_C$.

$$T_{82} = K \times t_C + \alpha \quad (21)$$

It is noted that K is a constant value $(=t_{B0}/t_{C0})$; in case the overcurrent has a non-zero finite value at the time point when $[V_G > V_1]$ is satisfied (measurement initiation time point of $t_B$ and $t_C$), $\alpha$ is a constant value for correcting that. $[T_{82} = K \times N_{83} \times T_C + \alpha]$ of the above-mentioned equation (13) is equivalent to equation (21). That is, $(N_{83} \times T_C)$ corresponds to the time interval $t_C$.

The time interval $T_{82}$ is set in the counter 82. It is noted that the time interval $t_C$ is measured by the counter 83 and is output to the counter 82. Whether or not $V_{DS}$ reaches $V_{DSB}$ within the time interval $T_{82}$ is determined by the D type flip-flop 80 and the counter 82.

It is noted that, instead of obtaining $T_{82}$ according to equation (21) every time, $T_{82}$ may be read out from a correspondence table, which is calculated according to $t_C$ in advance and is written into the correspondence table.

The path inductance is about 1 μH/m, and is proportional to the wiring length. When the wiring length increases, the wiring resistance increases and R from equation (19)

increases by this amount. That is, the condition that R is a constant value is not perfectly satisfied if the inductance L varies, so that K from equation (21) does not precisely become a constant value. In case this deviation is not tolerable, it is necessary to correct the deviation. For example, a correspondence table is prepared in consideration of the deviation, and an appropriate $T_{82}$ can be set by using this correspondence table.

The operation of the second overcurrent protection signal generating circuit 8 will now explained.

(When [$V_{DS} \leq V_{DSC}$] is Satisfied.)

After the switch 11 is turned on (when the FET 60 is turned on), the output of the comparator 53 becomes H when [$V_G > V_1$] is satisfied. This timing point is set as $t_0$, which is the starting point of the measurement of the time period relating to the detecting operation.

When the output of the comparator 53 and the output of the timer 73 become H ("T mode"), the output H of the AND circuit 86 is input to the clock circuit 85 and to the counters 83 and 82 as a reset cancel signal. As a result, the clock circuit 85 outputs clock signals and the counter 82 counts these clock signals.

Although the time when [$V_G = V_1$] is satisfied is set as time $t_0$, if $V_{DSt0}$ represents the value of the drain-source voltage $V_{DS}$ at time $t_0$, and $V_{thFET60}$ represents the threshold voltage of the FET 60, [$V_G - V_2 \approx V_{th\ FET60}$] is satisfied. Since [$V_G = V_1$] is satisfied at time $t_0$, [$V_{DSt0} = V_1 - V_2 \approx V_{th\ FET60}$] is established. Since the magnitude of $V_{th\ FET60}$ is 3 to 4V, $V_{DSt0}$ is 3 to 4V.

On the other hand, because $V_{DSA}$ at the time when the output of the comparator 33 becomes H in the "I mode" is at most 100 mV, [$V_{DSt0} > V_{DSA}$] is satisfied. Thus, the output of the comparator 33 becomes H just after $t_0$, and the output of the timer 73 becomes H. Namely, it transitions from the "I mode" to the "T mode".

After $t_0$, because $V_{DS}$ decreases rapidly and $I_5$ begins to flow in the "T mode", $V_Y$ is pulled down (decreased) and the output of the comparator 33 returns to L.

While [$V_{DS} \leq V_{DSC}$] is satisfied after $t_0$, the output of the comparator 34 is H, and the output of the AND circuit 84 is a clock signal corresponding to the clock signal from the clock circuit 85. This output is input to the counter 83 and counted.

It is noted that, since [$V_{X1} > V_Y$] is satisfied, [$V_X > V_Y$] is satisfied. Therefore, the output of the comparator 33 is L, and the output of the AND circuit 74 is L.

(When [$V_{DS} > V_{DSC}$] is Satisfied: When the Measurement of $t_C$ Ends)

This time point is the time point when curves 1 to 3 shown in FIG. 6 reach $V_{DSC}$. Time $t_C$ until this time point is reached is different in accordance with the rate of increase of the curve. It is understood from FIG. 6 that the larger the rate of increase of $V_{DC}$ is, the shorter the time $t_C$ until reaching $V_{DSC}$ is ($t_{C1} < t_{C2} < t_{C3}$).

When [$V_{DS} > V_{DSC}$] is satisfied, the output of the comparator 34 becomes L. As a result, the clock signal from the AND circuit 84 is no longer output, and the counting by the counter 83 is stopped.

The count value at the time when the counting is stopped is a first count value $N_{83}$. $N_{83}$ of each of curves 1, 2 and 3 can be expressed as $N_{831}$, $N_{832}$ and $N_{832}$, and if the clock period is represented as $T_C$, then $t_{C1}$, $t_{C2}$ and $t_{C3}$ can be expressed as follows.

$$t_{C1} = N_{831} \times T_C$$

$$t_{C2} = N_{832} \times T_C$$

$$t_{C3} = N_{833} \times T_C$$

The counter 83 outputs the time $t_C (= N_{83} \times T_C)$, which is a time interval until the counting is stopped, to the counter 82.

When the counter 82 receives the time $t_C$, the counter 82 calculates the rate of increase detection time $T_{82}$ [$T_{82} = K \times N_{83} \times T_C + \alpha$] according to the above-mentioned equation (13) and sets it in the counter 82. Let $T_{821}$, $T_{822}$ and $T_{823}$ represent each $T_{82}$ of $V_{DS}$ curves 1, 2 and 3. The counter 82 continues to count and maintains H at the Q-bar output terminal until the count period reaches $T_{82}$. When the count period reaches $T_{82}$, the Q-bar output terminal becomes L.

(When [$V_{DS} > V_{DSB}$] is Satisfied; the Determination Timing of the Overcurrent)

This time point is the time point when curves 1 to 3 shown in FIG. 6 reach $V_{DSB}$. The count value of the counter 82 (hereinafter, referred to as the "second count value") at this time point is represented as $N_{B1}$, $N_{B2}$ and $N_{B3}$ in each of curves 1, 2 and 3, and times $t_{B1}$, $t_{B2}$ and $t_{B3}$ when curves 1, 2 and 3 reach $V_{DSB}$ are expressed as follows.

$$t_{B1} = N_{B1} \times T_C \tag{22}$$

$$t_{B2} = N_{B2} \times T_C \tag{23}$$

$$t_{B3} = N_{B3} \times T_C \tag{24}$$

Since curve 2 is a curve that corresponds to the threshold value ($t_{B0}/t_{C0}$), [$T_{822} = t_{B2}$] is satisfied. Thus, [$T_{821} > t_{B1}$] and [$T_{823} < t_{B3}$] are satisfied.

When $V_{DS}$ reaches $V_{DSB}$, because the output of the comparator 33 becomes H, the output of the AND circuit 74 increases from L to H. This output H is input to the CLK terminal of the D type flip-flop 80.

When H is input to the CLK terminal of the D type flip-flop 80 while H is input to the R-bar terminal of the D type flip-flop 80 (within $T_{82}$), the Q output terminal of the D type flip-flop 80 becomes H. As a result, the control circuit 16 turns off the FET 60.

Curve 1 of FIG. 6 corresponds to this case, since [$V_{DS} > V_{DSB}$] is satisfied at the time $t_{B1} (= N_{B1} \times T_C)$ before reaching the rate of increase detection time $T_{821}$ which is set by the counter 82. Even if H is input to the CLK terminal of the D type flip-flop 80 while L is input to the R-bar terminal of the D type flip-flop 80 (after the lapse of $T_{82}$), the Q output terminal of the D type flip-flop 80 is maintained at L. That is, since the rate of increase is smaller than the reference value, the overcurrent protection is not performed.

In the case of curve 3 of FIG. 6, [$V_{DS} > V_{DSB}$] is satisfied at the time $t_{B3} (= N_{B3} \times T_C)$ after the rate of increase detection time $T_{823}$ has elapsed. Thus, this rate of increase is smaller than the threshold values ($t_{B0}/t_{C0} = T_{821}/t_{C1} = T_{822}/t_{C2} = T_{823}/t_{C3}$) and it corresponds to this case.

[Second Embodiment]

Figure 2:
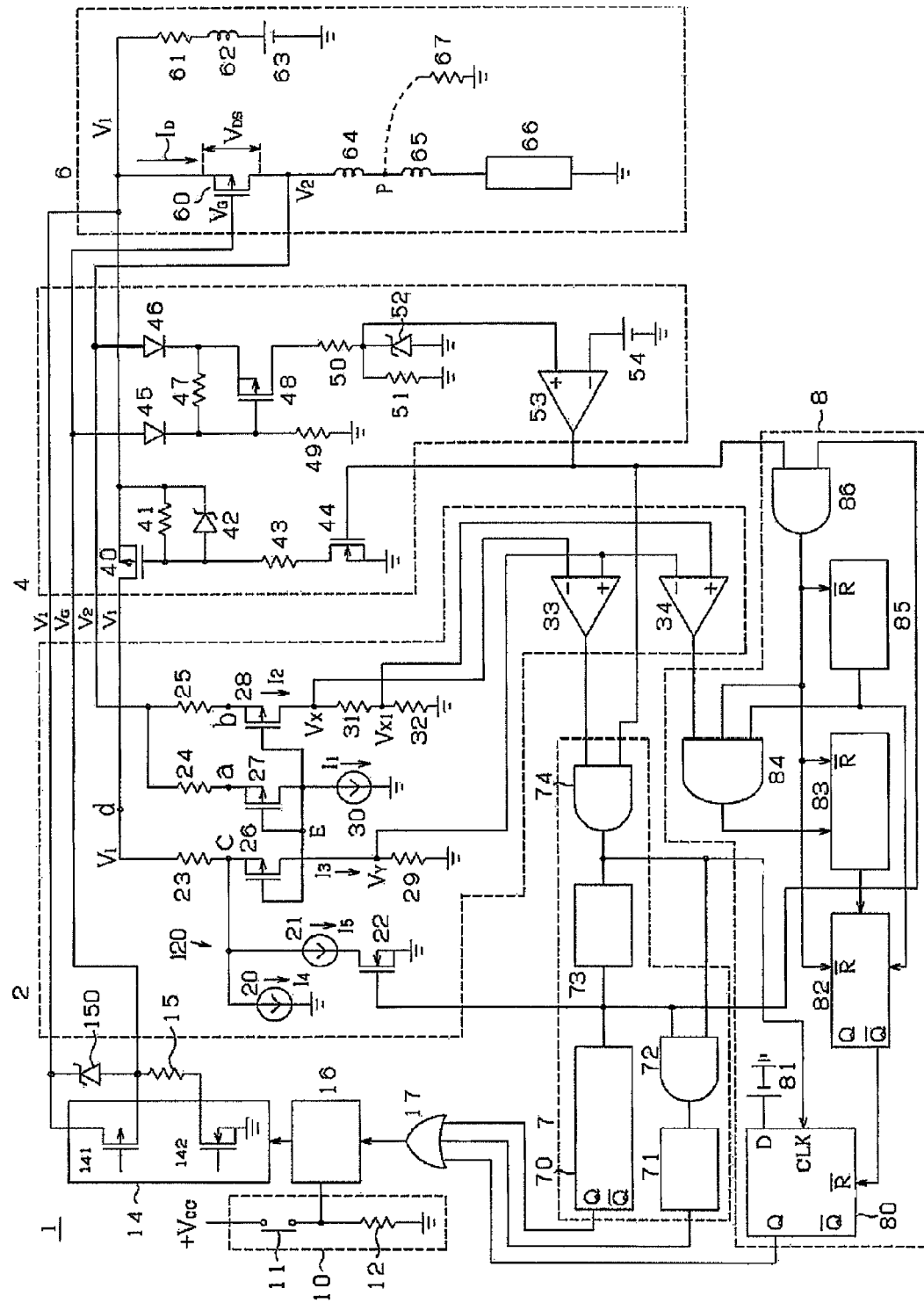
FIG. 2 is a circuit diagram showing a second embodiment of the overcurrent protection power supply apparatus of the present teachings.

FIG. 2 is a figure that shows a second embodiment of the overcurrent protection power supply apparatus of the present teachings. The same components as those in FIG. 1 are denoted by the same symbols.

A first difference from the first embodiment is that a P type MOSFET is used as the FET 60.

A second difference is that a Zener diode 150 is disposed between the source and the gate of the FET 60. As a result, the gate-source voltage of the FET 60 can be prevented from being larger than the Zener voltage (e.g., 15V) of the Zener diode 150.

A third difference is that the connections of the input terminals of the comparator 53 are interchanged. That is, the inverting input terminal of the comparator 53 is connected to the DC power source 54 and the non-inverting input terminal is connected to a connecting point between the Zener diode 52 and the resistor 50.

A fourth difference is that the charge pump circuit 13 of FIG. 1 is omitted in favor of using a P type MOSFET as the FET 60.

A fifth difference is that the connection end of the anode of diode 46 has been changed to the $V_2$ line instead of the $V_1$ line.

The remainder is identical to FIG. 1. In this embodiment, $V_1$ is the source voltage and $V_2$ is the drain voltage of the FET 60.

In addition, the source of the FET 60 is a representative example of the "electrode of the DC power source side of the FET" of the present teachings and the drain of the FET 60 is a representative example of the "electrode of the load side of the FET" of the present teachings.

When the FET 141 of the drive circuit 14 is on (the FET 142 is off), the gate and the source of the FET 60 are short circuited ($[V_G=V_1]$), so that the FET 60 is off.

The gate voltage of the FET 48 is lower than $V_G$ by only the forward voltage (0.6V) of the diode 45. On the other hand, since $[V_G>V_2]$, the diode 46 is reverse biased and a potential difference is not generated across the resistor 47, so that the FET 48 is off. As a result, the output of the comparator 53 is L.

When the FET 142 of the drive circuit 14 turns on (the FET 141 turns off), the gate of the FET 60 is grounded via the resistor 15, so that the gate voltage $V_G$ decreases toward a voltage which is lower (for example, a 15V lower voltage) than the source voltage $V_1$. When ($V_1$-$V_G$) exceeds the threshold voltage of the FET 60, the FET 60 turns on and the drain voltage $V_2$ increases.

When $V_2$ approaches $V_1$ and then $[V_G<V_2]$, because the voltage generated by dividing $V_2$ by the resistors 47 and 49 is supplied to the gate of the FET 48, the FET 48 turns on. As a result, the output of the comparator 53 becomes H. Hereinafter, the operation is the same as the first embodiment of FIG. 1.

[Third Embodiment]

Figure 3:
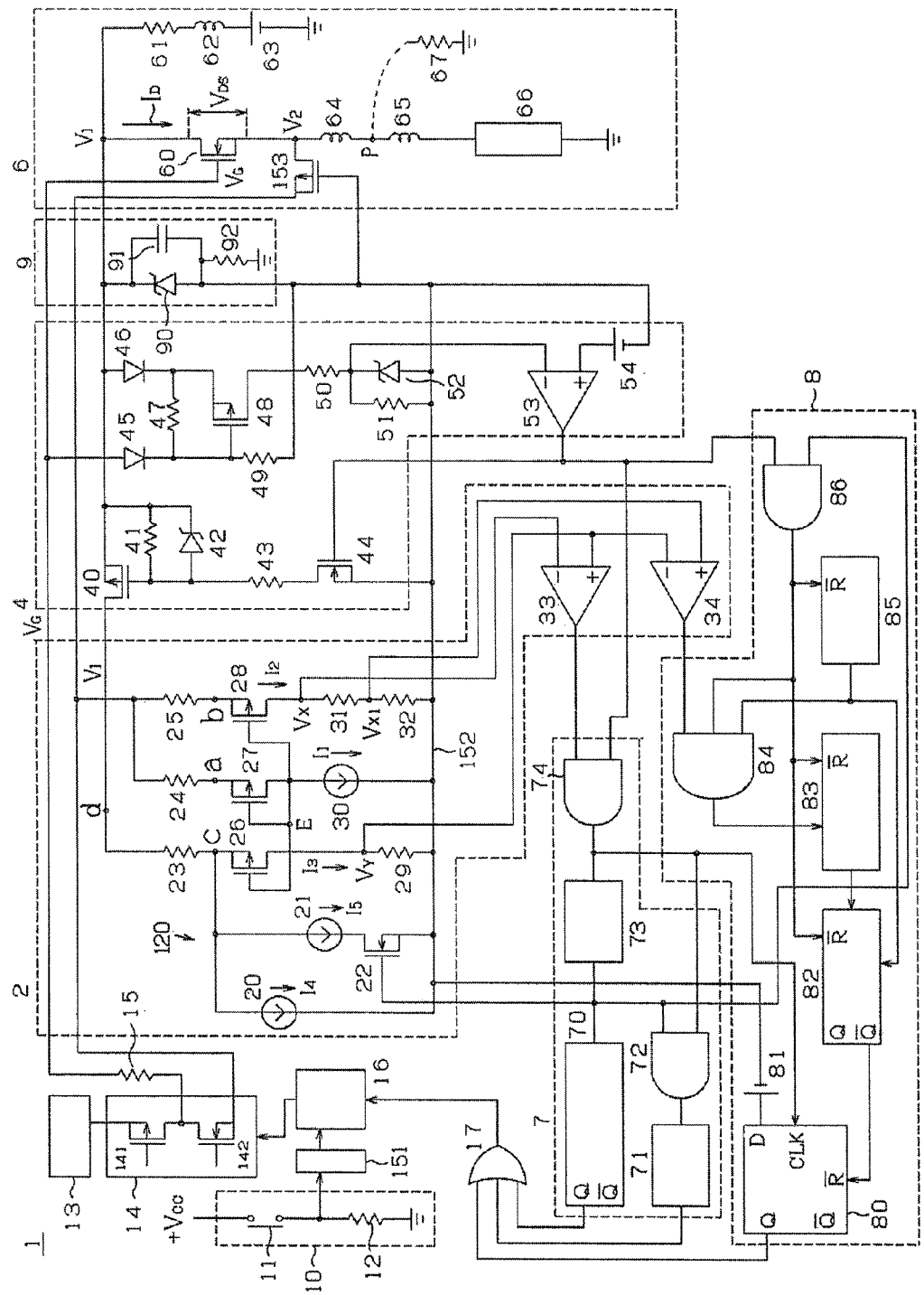
FIG. 3 is a circuit diagram showing a third embodiment of the overcurrent protection power supply apparatus of the present teachings.

FIG. 3 is a figure that shows a third embodiment of the overcurrent protection power supply apparatus of the present teachings. The same components as those in FIG. 1 are denoted by the same symbols.

According to the first embodiment, the positive electrodes and the negative electrode of the drain-source voltage detecting circuit 2 and the drain-source voltage detection initiation circuit 4 are respectively connected to the positive electrode and the negative electrode of the DC power supply circuit 6. Therefore, it is necessary to use FETs, which constitute the drain-source voltage detecting circuit 2 and the drain-source voltage detection initiation circuit 4, that have a breakdown voltage (the maximum absolute rated voltage between the drain and source) higher than the power supply voltage of the DC power source 63. For example, in case the voltage of the DC power source 63 is 500V, it is necessary to use a FET having a breakdown voltage greater than 500V. However, because such FETs have a large area, the chip area (chip size) becomes large when converting them into an IC. In this case, the parasitic capacitance of the FET increases, so that the responsiveness of the FET deteriorates and costs increase.

According to the third embodiment, a constant voltage circuit 9 that supplies a constant voltage lower than the power supply voltage of the DC power source 63 is provided. As a result, FETs having a low breakdown voltage can be used as the FETs in the drain-source voltage detecting circuit 2 and the drain-source voltage detection initiation circuit 4.

In FIG. 3, the constant voltage circuit 9 is arranged between the electric power supply circuit 6 and the drain-source voltage detection initiation circuit 4. The constant voltage circuit 9 comprises a Zener diode 90 having a cathode connected to the power supply terminal of the FET 60, a resistor 92 having one end connected to the anode of the Zener diode 90 and the other end connected to ground, and a capacitor 91 connected to both ends of the Zener diode 90.

Furthermore, the Zener voltage generated across the two ends of the Zener diode 90 is supplied to the drain-source voltage detecting circuit 2 and to the drain-source voltage detection initiation circuit 4. The negative electrodes of the drain-source voltage detecting circuit 2 and the drain-source voltage detection initiation circuit 4 are connected to a connecting point between the Zener diode 90 and the resistor 92 via a negative electrode line 152.

The overcurrent protecting operation of this embodiment is the same as that of the first and the second embodiments.

It is noted that the capacitor 91 connected in parallel with the Zener diode 90 has the function of keeping the voltage at a constant value by absorbing voltage variations between $V_1$ and ground. Furthermore, it has the effect of suppressing the influence of high frequency voltage pulses (noise) supplied from the outside.

Optionally, a photo coupler 151 is provided to electrically isolate the control circuit 16 from the switch circuit 10.

In addition, in FIG. 3, although an N type MOSFET is used as the FET 60, it can be configured in the same manner even if a P type MOSFET is used.

[Fourth Embodiment]

Figure 4:
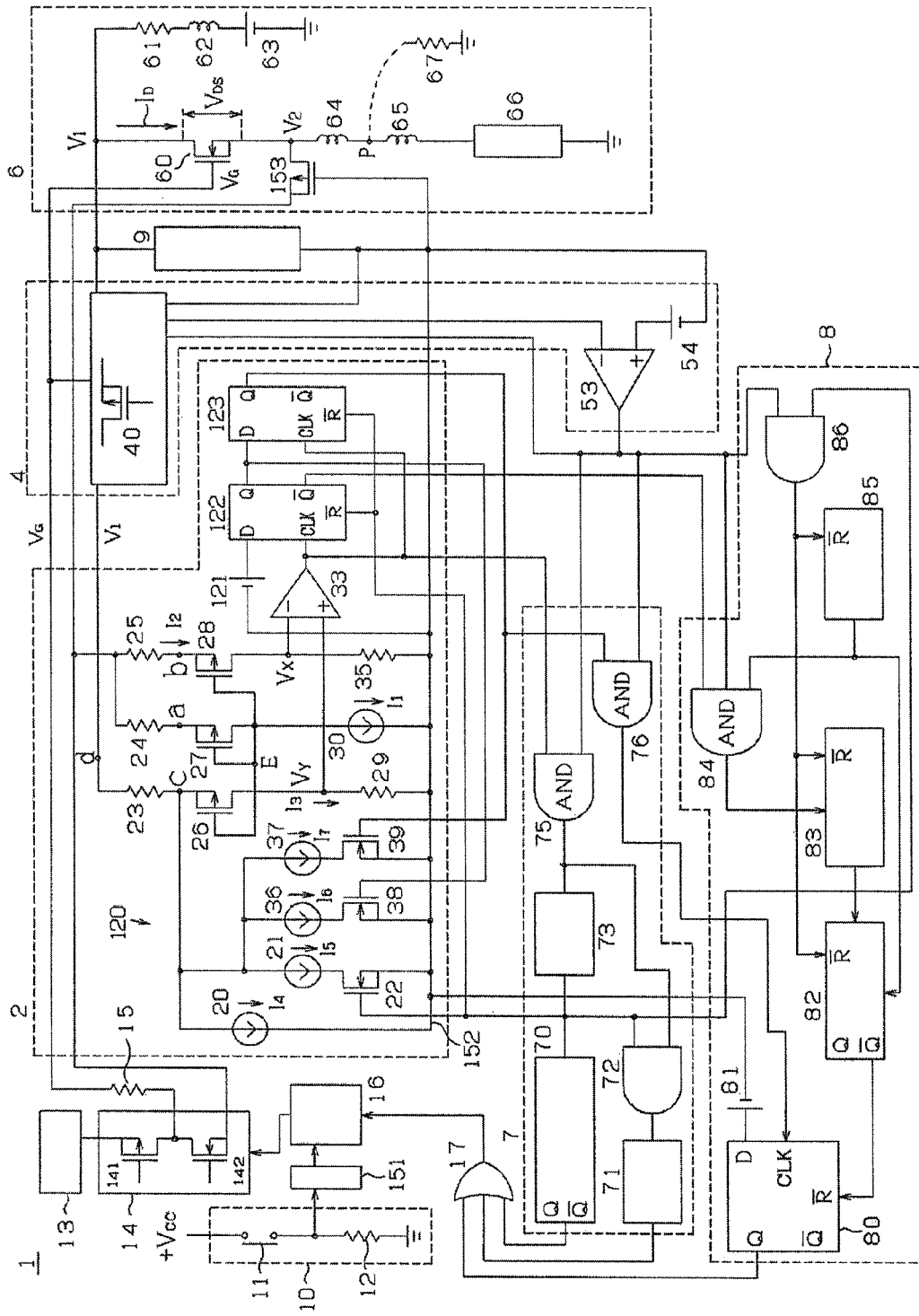
FIG. 4 is a circuit diagram showing a fourth embodiment of the overcurrent protection power supply apparatus of the present teachings.
Figure 5:
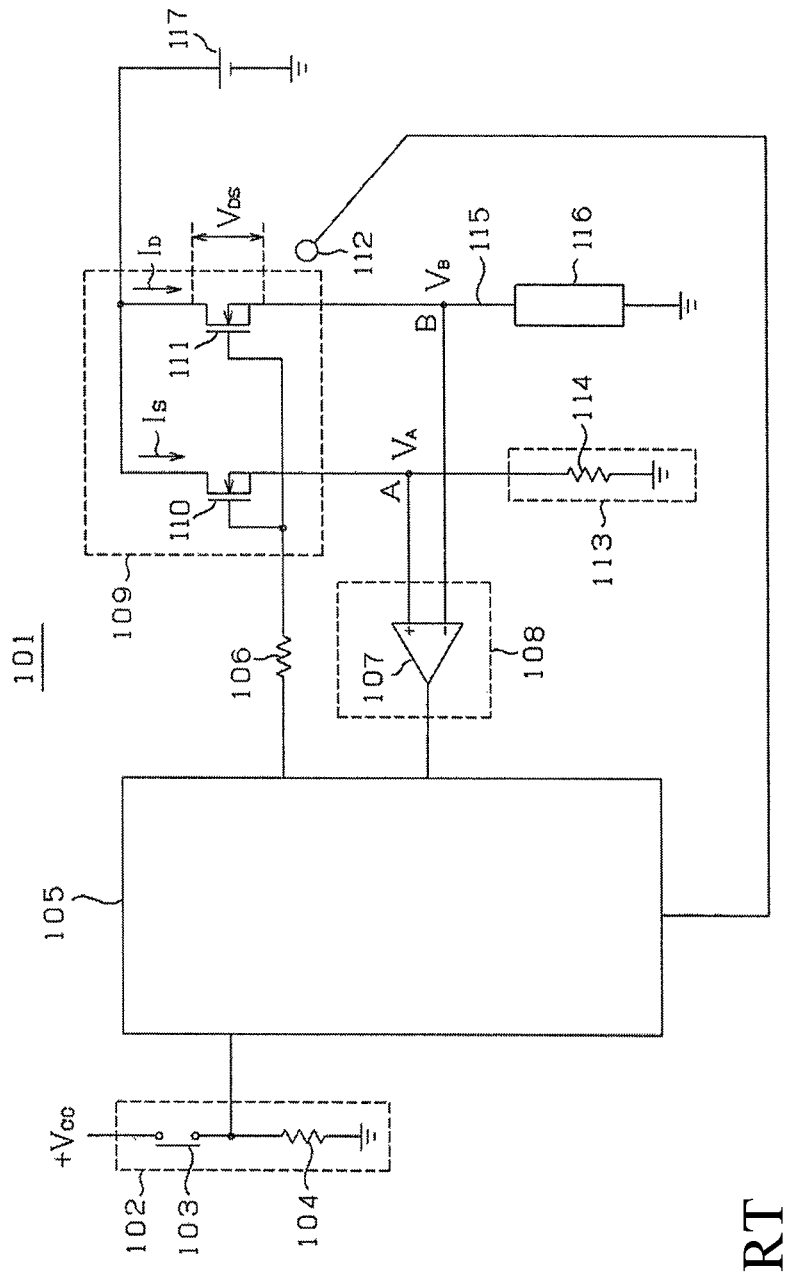
FIG. 5 is a circuit diagram showing a conventional overcurrent protection power supply apparatus.

FIG. 4 is a figure that shows a fourth embodiment of the overcurrent protection power supply apparatus of the present teachings. The same components as those in FIG. 3 are denoted by the same symbols.

The drain-source voltage detecting circuit 2 used in this embodiment is different from the drain-source voltage detecting circuit 2 used in the third embodiment of FIG. 3 in the following manner.

(1) A resistor 35 is used instead of the resistors 31 and 32.
(2) The comparator 34 is omitted.
(3) D type flip-flops 122 and 123, which process the output of the comparator 33, have been added.
(4) The number of parallel constant current source circuits constituting the detection voltage reducing circuit 120 has been increased.

The resistor 35 is connected to the drain of the FET 28. The resistance of the resistor 35 is set to be equal to the resistance of the resistor 29 that is connected to the FET 26. The voltage generated across the two ends of the resistor 35 is denoted as $V_X$.

The comparator 33 compares $V_X$ with $V_Y$, in which $V_X$ is input to the inverting input terminal and $V_Y$ is input to the non-inverting input terminal. The output of the comparator 33 is connected to each clock terminal CLK of the D type flip-flops 122 and 123 and to one of the input terminals of an AND circuit 75 of the first overcurrent protection signal generating circuit 7.

The positive electrode of a DC power source 121 is connected to terminal D of the D type flip-flop 122 and the negative electrode is connected to the negative electrode line 152. The Q output terminal of the D type flip-flop 122 is connected to the terminal D of the D type flip-flop 123 and the gate of FET 38. The Q output terminal of the D type flip-flop 123 is connected to the gate of FET 39 and to one of the input terminals of an AND circuit 76.

The first overcurrent protection signal generating circuit 7 of this embodiment is different from that of the third embodiment shown in FIG. 3 as follows.
(1) The AND circuit 74 used in the third embodiment is omitted and the AND circuits 75 and 76 have been added.
(2) The output of the timer 73 has also been connected to the reset terminals R-bar of the D type flip-flops 122 and 123.

The input terminals of the AND circuit 75 are connected to the output terminals of the comparators 33 and 53. The output terminal of the AND circuit 75 is connected to the input terminals of the timer 73 and the AND circuit 72.

The input terminals of the AND circuit 76 are connected to the Q output terminal of the D type flip-flop 123 and to the output terminal of the comparator 53. The output of the AND circuit 76 is connected to the clock terminal CLK of the D type flip-flop 80.

The overcurrent protection power supply apparatus of this embodiment operates as follows.

(When [$V_G<V_1$] is Satisfied)

When the FET 60 is off or [$V_G<V_1$] is satisfied even if the FET 60 turns on, the output of the comparator 53 is L. As a result, the output of the timer 73 is L, so that the FET 22 is turned off. The D type flip-flops 122 and 123 are reset, so that FETs 38 and 39 are turned off. Although $I_1$ and $I_2$ flow, $I_3$ to $I_7$ do not flow since the FET 40 is turned off.

(When [$V_G>V_1$] is Satisfied)

When [$V_G>V_1$] is satisfied, the output of the comparator 53 becomes H, and the FET 40 turns on. As a result, $I_4$ flows and the "I mode" starts.

In addition, $V_{DS}$ is larger than $V_{DSA}$ just after [$V_G>V_1$] is satisfied. Thus, [$V_Y>V_X$] is satisfied, and the output of the comparator 33 becomes H.

The outputs of the AND circuit 75, the timer 73 and the AND circuit 86 become H when the outputs of the comparators 53 and 33 become H; resets of counters 82, 83 and the clock circuit 85 are released due to the output H from the AND circuit 86. As a result, the clock circuit 85 outputs the clock signal to the AND circuit 84 and to the counter 82.

Further, when the output from the timer 73 becomes H, the "T mode" starts and resets of the D type flip-flops 122 and 123 are released. When the "T mode" starts, the FET 22 turns on, and $I_5$ starts to flow. As a result, $I_1$, $I_4$ and $I_5$ flow, but $I_6$ and $I_7$ do not flow. Thus, the threshold value $V_{DSC}$ of the T mode is set.

It is noted that when $I_5$ starts to flow, because $I_3$ decreases by that amount, $V_Y$ is pulled down. As a result, [$V_Y<V_X$] is satisfied, and the output of the comparator 33 returns to L.

Since the output of the Q-bar output terminal of the D type flip-flop 122 is maintained at H, the AND circuit 84 passes the clock signal from the clock circuit 85 to the counter 83 and the counter 83 counts the inputted clock signals.

(When $I_D$ Increases and then $V_{DS}$ Reaches $V_{DSC}$ ([$V_{DS}>V_{DSC}$]))

When $V_Y$ increases due to the increase of $I_D$ ($V_{DS}$) and then [$V_Y>V_X$] ([$V_{DS}>V_{DSC}$]) is satisfied, the output of the comparator 33 becomes H. As a result, the Q-bar output of the D type flip-flop 122 becomes L and the Q output becomes H.

When the Q-bar output of the D type flip-flop 122 becomes L, the output of the AND circuit 84 becomes L, so that the counting by the counter 83 is stopped. At this time, the counter 83 calculates $t_C$ by multiplying the count value thus far by the clock period $T_C$ and outputs the calculated $t_C$ to the counter 82. The counter 82 sets the rate of increase detection time $T_{82}$ based on the received $t_C$ and maintains the Q-bar output as H until the rate of increase detection time $T_{82}$ has elapsed.

When the Q output of the D type flip-flop 122 becomes H, the FET 38 turns on; the currents $I_1$, $I_4$, $I_5$ and $I_6$ flow, but the current $I_7$ does not flow. Due to this state, the threshold value $V_{DSB}$ of the "T mode" is set.

It is noted that, when the current $I_6$ starts to flow, because the current $I_3$ decreases by that amount, $V_Y$ is pulled down, and [$V_Y<V_X$] is satisfied, so that the output of the comparator 33 returns to L.

(When $I_D$ Increases Again and $V_{DS}$ Reaches $V_{DSB}$)

When $V_Y$ increases due to the increase of $I_D$ ($V_{DS}$) and [$V_Y>V_X$] ([$V_{DS}>V_{DSB}$]) is satisfied, the output of the comparator 33 becomes H. As a result, the Q-bar output of the D type flip-flop 123 becomes L, and the Q output becomes H.

When the Q output of the D type flip-flop 123 becomes H, the output of the AND circuit 76 becomes H, and also the FET 39 turns on.

The output H from the AND circuit 76 is input to the clock input terminal CLK of the D type flip-flop 80. H from the counter 82 is input to the reset terminal R-bar of the D type flip-flop 80 until the rate of increase detection time $T_{82}$ has elapsed. In case H is input to the clock input terminal CLK within this rate of increase detection time $T_{82}$, the Q output terminal of the D type flip-flop 80 becomes H. This output H is input to the control circuit 16 via the OR circuit 17. In case H is input to the clock input terminal CLK after the rate of increase detection time $T_{82}$ has elapsed, the Q output terminal of the D type flip-flop 80 is maintained at L.

Furthermore, when the FET 39 turns on, the currents $I_1$, $I_4$, $I_5$, $I_6$ and $I_7$ flow. Due to this state, the threshold value $V_{DSD}$ of the "T mode" is set.

It is noted that, when the current $I_7$ starts to flow, because $I_3$ decreases by that amount, $V_Y$ is pulled down, and [$V_Y<V_X$] is satisfied, so that the output of the comparator 33 returns to L.

(When $I_D$ Increases Again and $V_{DS}$ is Increased Up to $V_{DSD}$)

When $V_Y$ increases due to the increase of $I_D$ ($V_{DS}$) and then [$V_Y>V_X$] ([$V_{DS}>V_{DSD}$]) is satisfied, the output of the comparator 33 becomes H. As a result, the output of the AND circuit 75 becomes H. The output H from the AND circuit 75 is input to one of the input terminals of the AND circuit 72 and to the timer 73. In this case, since the addition of a drawing current for pulling down (decreasing) $V_Y$ does not occur, the output of the comparator 33 is maintained at H, so that the outputs of the AND circuits 75 and 72 are maintained at the H state.

The output H of the AND circuit 72 is input to the digital filter 71. Furthermore, when the output H from the AND circuit 72 is maintained for a predetermined period, the output of the digital filter 71 becomes H, so that the overcurrent protection signal is input to the control circuit 16.

This embodiment has following advantages.

According to this embodiment, just before the output of the comparator 33 becomes H after [$V_Y=V_X$] is satisfied, both drain currents of FETs 26 and 28 which generate $V_Y$ and $V_X$ respectively are equal, so that there is no electric potential difference between the sources of the FETs 26 and 28. As a result, when setting the threshold value, because it is not affected by $R_{ON1}$ of equation (12), the threshold value can be set precisely.

Although in the first to the third embodiment shown in FIGS. 1 to 3, the reference voltages $V_X$ and $V_{X1}$ are set by using the resistors 31 and 32, in this embodiment they are set by changing the drawn current by increasing the constant current that the constant current circuit draws from point c. Thus, in case the overcurrent protection power supply apparatus is integrated into an IC, the threshold values can be changed by trimming the currents values.

Since the symmetry of the drain-source detecting circuit 2 is improved, immunity with respect to high frequency noise is improved.

Since the number of comparators is reduced by implementing equivalent functions with digital circuits, the chip area can be reduced.

[Fifth Embodiment]

Figure 8:
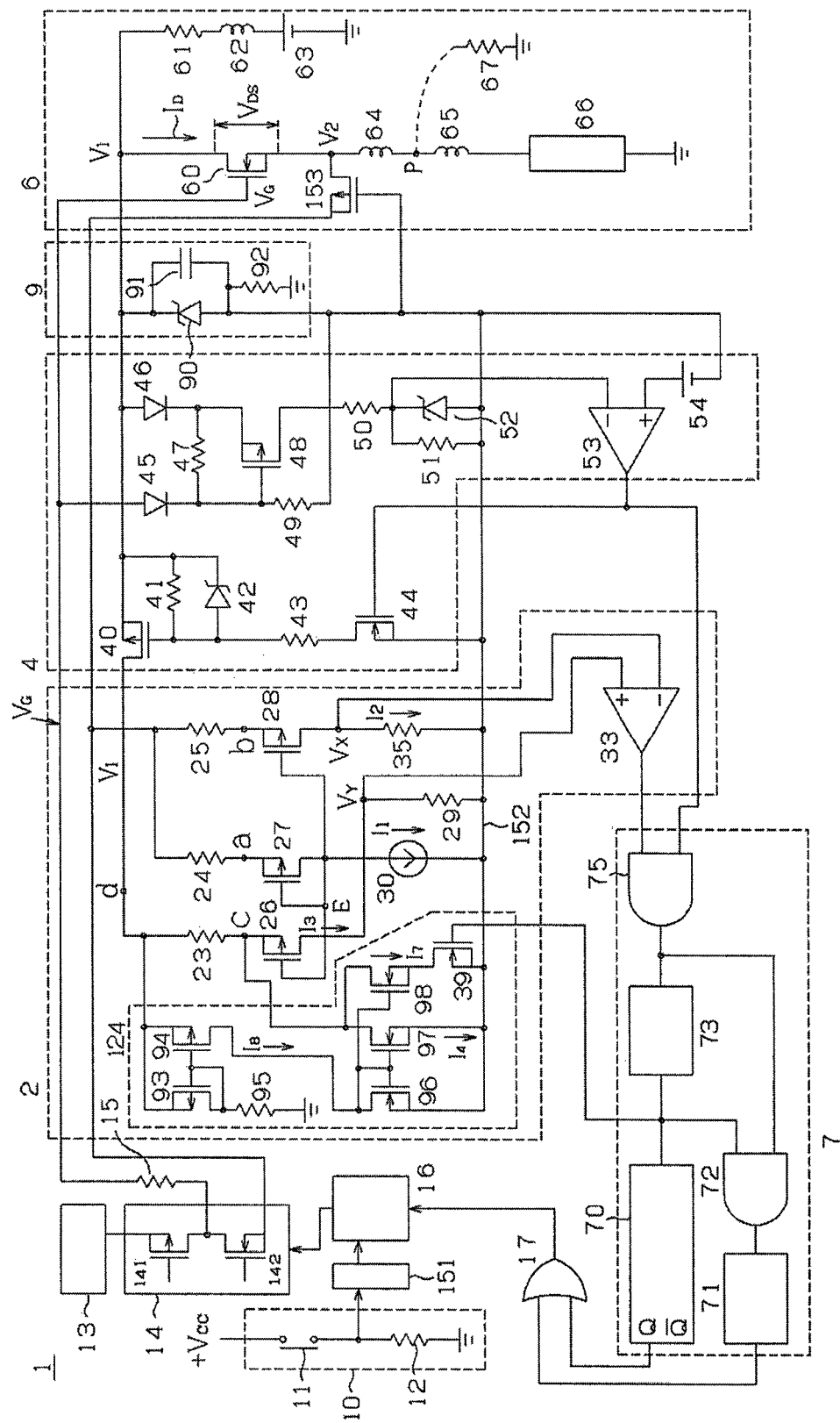
FIG. 8 is a circuit diagram showing a fifth embodiment of the overcurrent protection power supply apparatus of the present teachings.

FIG. 8 is a figure that shows a fifth embodiment of the overcurrent protection power supply apparatus of the present teachings. The same components as those of FIGS. 3 and 4 are denoted by the same symbols.

It is noted that, although an N-type MOSFET is used as the FET 60 in FIG. 8, a P-type MOSFET can be used as the FET 60. In this case, the other FETs may be changed as necessary.

According to this embodiment, the second overcurrent protection signal generating circuit 8 shown in FIG. 4 is omitted; the configuration of the drain-source voltage detecting circuit 2 is modified accordingly.

The modification details of the configuration of the drain-source voltage detecting circuit 2 are as follows.

The DC power source 121 and the D type flip-flops 122 and 123 are omitted from the drain-source voltage detecting circuit 2 shown in FIG. 4.

A drain-source voltage threshold value setting circuit 124 is used instead of the detection voltage reducing circuit 120.

One representative example of the drain-source voltage threshold value setting circuit 124 will be explained.

The source and the drain of a P type MOSFET 93 and a resistor 95 are arranged in series between point d and ground. In addition, between point d and the negative electrode line 152, the source and the drain of a P type MOSFET 94, which forms a current mirror circuit with the FET 93, and the drain and the source of an N type MOSFET 96 are arranged in series.

N type MOSFETs 97 and 98 form a current mirror circuit with the FET 96. The drain of the FET 97 is connected to the source (point c) of the FET 26 and its source is connected to the negative electrode line 152. The drain of FET 98 is connected to the source (point c) of the FET 26 and its source is connected to the drain of an N type MOSFET 39. The source of the FET 39 is connected to the negative electrode line 152 and its gate is connected to the output of the timer 73.

The operation of this embodiment will now be explained.

(When $[V_G<V_1]$ is Satisfied)

When the FET 60 is off or $[V_G<V_1]$ is satisfied even if the FET 60 turns on, the output of the comparator 53 is L, and the FET 40 is off.

In addition, since the output of the comparator 53 is L, the outputs of the AND circuit 75 and the timer 73 are L, so that the FET 39 is off ("I mode").

(When $[V_G>V_1]$ is Satisfied.)

When $[V_G>V_1]$ is satisfied, the output of the comparator 53 becomes H. Thus, the FET 40 turns on, so that currents $I_3$, $I_4$ and $I_5$ start to flow. At this time, $V_{DS}$ becomes a large value before the saturation, so that it is larger than the threshold $V_{DSA}$. Therefore, the current $I_3$ flowing through the resistor 29 is larger than the current $I_2$ flowing through the resistor 35 ($[I_3>I_2]$). Thus, $[V_Y>V_X]$ is satisfied, so that the output of the comparator 33 becomes H. As a result, since the outputs of comparators 33 and 53 are H, the output of the AND circuit 75 becomes H, so that the output of the timer 73 becomes H. When the output of the timer 73 becomes H, the FET 39 turns on ("T mode").

When the current $I_7$ starts to flow due to the FET 39 turning on, the current drawn from point c is $[I_4+I_7]$. As a result, the threshold value $[V_{DSD}=R_{23}(I_4+I_7)]$ is set. The currents $I_4$ and $I_7$ are proportional to $I_8$. If $V_{th\ FET93}$ represents the threshold voltage of the FET 93 and $R_{95}$ represents the resistance of the resistor 95, $[I_8=(V_1-V_{th\ FET93})/R_{95}]$ is established. Since $[V_1\gg V_{th\ FET93}]$, $I_8$ is nearly proportional to $V_1$. That is, the currents $I_4$ and $I_7$ vary according to $V_1$ (nearly proportional to $V_1$). Thus, the threshold value $V_{DSD}$ also varies according to $V_1$ (nearly proportional to $V_1$).

In the present specification, the term "according to" encompasses the meanings of "proportional to" or "nearly proportional to".

It is noted that, when the current $I_7$ starts to flow, the current $I_3$ is reduced by that amount, so that $[I_3<I_2]$ is established. Thus, $[V_Y<V_X]$ is satisfied, and thereby the output of the comparator 33 returns to L.

(When an Overcurrent Flows)

When $I_D$ increases and $V_{DS}$ exceeds the threshold value $V_{DSA}$ of the "I mode", and when $[V_X<V_Y]$ is satisfied, the output of the comparator 33 becomes H, so that the output of the AND circuit 75 becomes H. As a result, the output of the timer 73 becomes H during the preset timer period $T_S$, and thereby the FET 39 turns on ("T mode").

When the current $I_7$ starts to flow in the T mode, $I_3$ ($V_Y$) decreases and $[V_X>V_Y]$ is satisfied, so that the output of the comparator 33 returns to L. The output H from the timer 73 is maintained during the preset timer period $T_S$.

(In Case of a Minor Overcurrent)

In case a minor overcurrent flows, after the T mode starts in which $V_Y$ is pulled down, the state of $[V_X>V_Y]$ is maintained during the preset timer period $T_S$. Therefore, after the preset timer period $T_S$ has elapsed, the output of the timer 73 returns to L, so that the FET 39 turns off ("I mode") and the pulling down of $V_Y$ is stopped. The counter 70 increments a count value every time the output of the timer 73 becomes H (every "T mode").

The operation performed when the minor overcurrent flows is the same as the first to the fourth embodiments.

(In Case of a Major Overcurrent)

In case a major overcurrent flows, because $V_{DS}$ continues to increase even after the T mode starts, the pulled down detection voltage $V_Y$ immediately begins to increase. Furthermore, before the preset timer period $T_S$ has elapsed, $V_{DS}$ reaches $V_{DSB}$, $[V_X<V_Y]$ is satisfied and the output of the comparator 33 becomes H. As a result, the output H from the AND circuit 72 is input to the digital filter 71.

The operation performed when a major overcurrent flows is the same as the first to the fourth embodiments.

Figure 9:
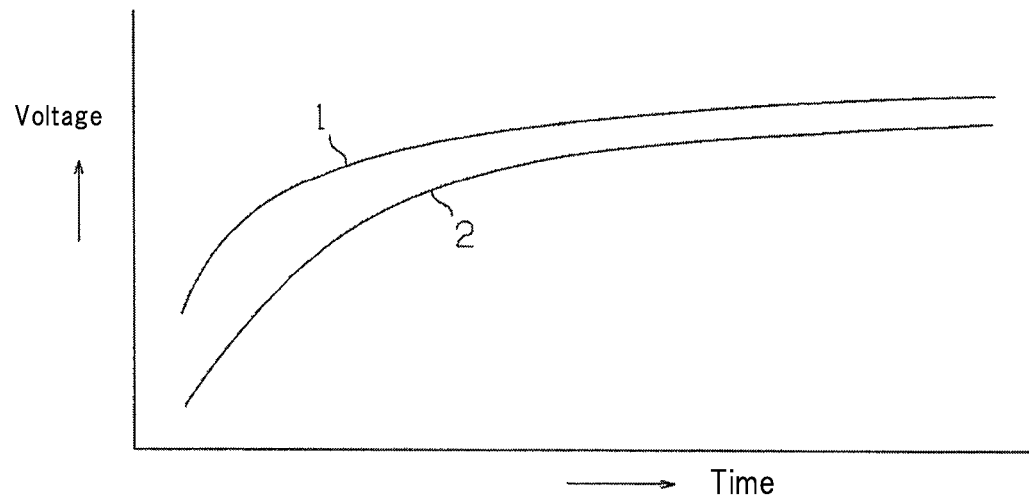
FIGS. 9(1) and (2) are charts showing the relationships between inrush currents or overcurrents and threshold values.
Figure 9:
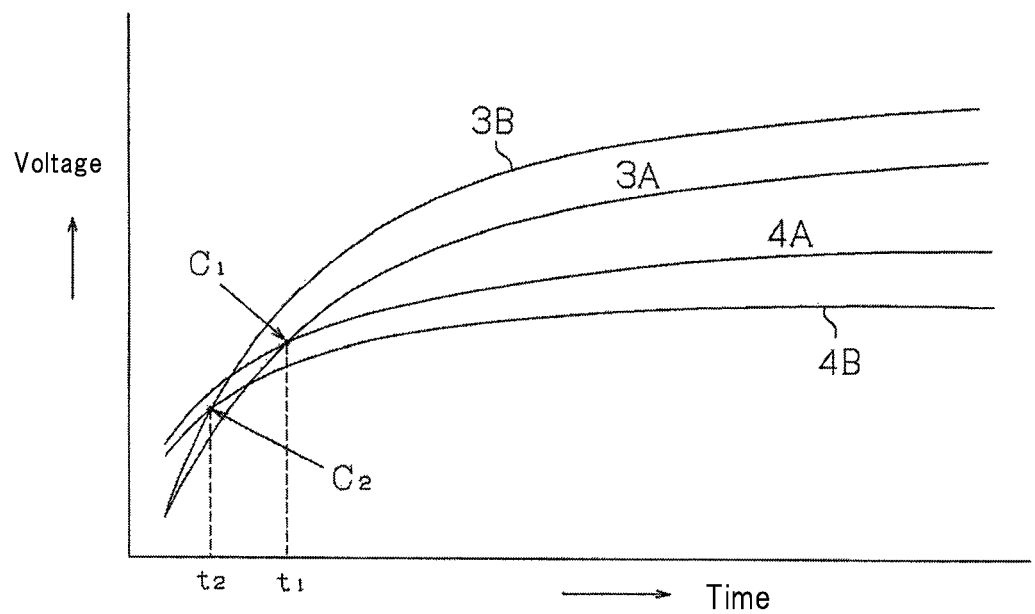

FIG. 9 is a figure that shows the relationship, in the fifth embodiment, between $V_{DS}$ when an inrush current or a ground current flows and the threshold value $V_{DSD}$ at that time. It is noted that the horizontal axis of FIG. 9 denotes the time and the vertical axis denotes the voltage. FIG. 9 (1) shows the relationship between $V_{DS}$ and $V_{DSD}$ when the inrush current flows. FIG. 9 (2) shows the relationship between $V_{DS}$ and $V_{DSD}$ when an overcurrent caused by a ground fault flows.

First, FIG. 9 (1) will be explained. Curve 1 represents the threshold value $V_{DSD}$ used to detect an overcurrent when the inrush current flows and curve 2 represents the value obtained by converting the inrush current into $V_{DS}$. Curve 2 increases rapidly at first, then increases gradually, and then becomes a nearly constant value (saturated). This means that the current $I_D$ flowing through the electric power supply circuit 6 increases rapidly at first and then converges at a nearly constant value as it approaches the saturated value (attained value).

Generally, when the FET 60 turns on, an inrush current flows through the electric power supply circuit 6. Therefore, it is necessary to configure it so as to prevent the overcurrent protection from being performed when the inrush current flows. In the other words, it is necessary for curve 1 to be located above curve 2 in the range from zero to saturation. If curve 2 crosses curve 1 at some point and then exceeds curve 1 (the threshold value), an overcurrent is detected and the overcurrent protecting operation is initiated.

The determination of $V_{DSD}$ and $V_{DS}$ and the relationship of $[V_{DSD} > V_{DS}]$ at the time of the inrush current generation will be explained.

Each of the threshold values $V_{DSA}$ and $V_{DSD}$ is defined as a voltage drop generated across the resistor 23 ($R_{23}$) by the current drawn from point c. Therefore, when the drawn current is only $I_4$, $[V_{DSA} = R_{23} \times I_4]$ is established; when the drawn current is $I_4 + I_7$, it is expressed by equation (25).

$$V_{DSD} = R_{23} \times (I_4 + I_7) \tag{25}$$

The current ($I_4 + I_7$) is a value that varies according to the voltage $V_1$. In this case, the current ($I_4 + I_7$) can be regarded as a value that is nearly proportional to the voltage $V_1$; if $K_1$ represents a proportionality factor, it is expressed by equation (26).

$$(I_4 + I_7) = K_1 \times V_1 \tag{26}$$

Equation (27) can be derived from equations (25) and (26).

$$V_{DSD} = R_{23} \times K_1 \times V_1 \tag{27}$$

$V_{DSD}$ at the saturated state can be obtained by substituting $V_1$ at the saturated state into $V_1$ of equation (27). If the on-resistance $R_{ON}$ of the FET 60 is disregarded, $V_1$ at the saturated state can be obtained as a constant voltage by dividing the power source voltage $V_B$ by the resistance components $R_{61}$ and $R_{66}$ within the circuit. $V_1$ at the saturated state is expressed by the equation $[V_1 = V_B \times R_{66}/(R_{61} + R_{66})]$.

Thus, $V_{DSD}$ at the saturated state is expressed by equation (28).

$$V_{DSD} = R_{23} \times K_1 \times V_B \times R_{66}/(R_{61} + R_{66}) \tag{28}$$

It is noted that, during the time when the inrush current $I_D$ is not yet saturated and is still in the increasing state, because voltage drops (counter electromotive forces) are generated due to the inductances in the electric power supply circuit 6, $V_1$ during that time is smaller than the value at the saturated state. Since the voltage drops due to the inductances are larger when the rate of increase of the inrush current $I_D$ is larger, $V_1$ becomes smaller when the rate of increase of the inrush current $I_D$ is larger.

The rate of increase of the inrush current $I_D$ is initially large, then it monotonically changes so as to gradually become smaller. Thus, $V_1$ gradually increases from a low value and it monotonically increases so as to become a constant value at the saturated state. Therefore, $V_{DSD}$ which is set according to $V_1$ also monotonically increases.

On the other hand, when there is an on resistance $R_{ON}$ of the FET 60, $V_{DS}$ at the time when the inrush current $I_D$ flows through the FET 60 is expressed by equation (29).

$$V_{DS} = R_{ON} \times I_D \tag{29}$$

The saturated value of the inrush current $I_D$ is expressed by equation (30).

$$I_D = V_B/(R_{61} + R_{66}) \tag{30}$$

Thus, $V_{DS}$ at the saturated state is expressed by equation (31).

$$V_{DS} = R_{ON} \times I_D = R_{ON} \times V_B/(R_{61} + R_{66}) \tag{31}$$

The inrush current $I_D$ monotonically increases and becomes a maximum value at the saturated state.

At first, it is considered to design the circuit so that $[V_{DSD} > V_{DS}]$ is satisfied at the saturated state when it becomes the maximum value.

Equation (32) is obtained by calculating $[V_{DSD} > V_{DS}]$ by using equations (28) and (31).

$$R_{23} \times K_1 \times R_{66} > R_{ON} \tag{32}$$

Equation (33) is obtained by rearranging equation (32).

$$K_1 > R_{ON}/(R_{23} \times R_{66}) \tag{33}$$

That is, when the inrush current $I_D$ saturates, $V_1$ also saturates, $V_{DS}$, which is proportional to the inrush current $I_D$, also saturates and $V_{DSD}$, which is proportional to V1, also saturates. It is understood that, in order for the saturated value of $V_{DSD}$ at this time to be larger than the saturated value of $V_{DS}$, $K_1$ is set to a value that satisfies equation (33).

If $K_1$ is set to a value that satisfies equation (33), equation (32) or (33) is satisfied while $I_D$ increases from zero to the saturated value since each of $R_{ON}$, $R_{23}$ and $R_{66}$ is a constant value and invariable while $I_D$ is increasing from zero to saturation.

When the current $I_D$ flows through the electric power supply circuit 6, $V_1$ is the sum of the voltage drop generated by the load 66 (resistance $R_{66}$) and the counter electromotive forces generated by inductances 64 and 65. In case the current $I_D$ monotonically increases, the direction of the counter electromotive forces generated by inductances 64 and 65 is opposite to the plus side of the FET 60 and the side of the load 66. As a result, it is apparent from the circuit configuration that $V_1$ is larger than the voltage drop generated across the two ends of the load 66 ($R_{66}$).

Consequently, equation (34) is obtained.

$$V_1 \geq R_{66} \times I_D \tag{34}$$

Equation (35) is obtained from equations (27) and (34).

$$V_{DSD} = R_{23} \times K_1 \times V_1 \geq R_{23} \times K_1 \times R_{66} \times I_D \tag{35}$$

Equation (36) can be derived from equations (32) and (35).

$$V_{DSD} > R_{ON} \times I_D \tag{36}$$

The current $I_D$ during this time represents a value from zero to the saturated value of the inrush current, and the right side value ($R_{ON} \times I_D$) represents $V_{DS}$.

Thus, equation (36) shows that $[V_{DSD} > V_{DS}]$ is satisfied from a zero inrush current until it reaches the saturated value. Therefore, if $K_1$ is set to a value that satisfies equation (33), the overcurrent protecting operation is not performed when the inrush current $I_D$ flows.

When the inrush current $I_D$ flows through the FET 60, the resistance between the source of the FET 60 and ground is $R_{66}$. $K_1$ that satisfies equation (33) with respect to $R_{66}$ is set, and the threshold value $V_{DSD}$ using this $K_1$ is represented as $V_{DSDK1}$. If the resistance between the source of the FET 60 and the ground is represented as $R_X$, wherein the converted value $V_{DS}$ of the saturated overcurrent $I_D$ flowing through resistance $R_X$ is equal to $V_{DSDK1}$, $V_{DS}$ at the saturated state and $V_{DSDK1}$ at the saturated state are expressed as follows.

$$V_{DS}(\text{saturated}) = R_{ON} \times I_D = R_{ON} \times V_B/(R_{61}+R_X)$$

$$V_{DSDK1}(\text{saturated}) = R_{23} \times K_1 \times V_1 = R_{23} \times K_1 \times V_B \times R_X/(R_{61}+R_X)$$

Since $V_{DS}(\text{saturated}) = V_{DSDK1}$ (saturated), $R_{ON}$ and $R_X$ are expressed by equation (37).

$$R_{ON} = R_{23} \times K_1 \times R_X$$

$$R_X = R_{ON}/(R_{23} \times K_1) \qquad (37)$$

Since equation (33) can be expressed as $[R_{66} > R_{ON}/(R_{23} \times K_1)]$, $R_X$ is smaller than $R_{66}$. If the proportionality constant $(R_{23} \times K_1)$ is determined when $V_{DSD}$ is proportional to $V_1$, the resistance $R_X$ at the time an overcurrent flows is determined by the equation (37) wherein $V_{DSDK1}$ is equal to $V_{DS}$ at the saturated state.

When the resistance between the source of the FET 60 and ground is smaller than $R_X$, $[V_{DS} > V_{DSD}]$ is satisfied at the saturated state, so that the FET 60 is turned off.

On the other hand, when the resistance between the source of the FET 60 and ground is larger than $R_X$, $[V_{DS} < V_{DSD}]$ is satisfied while the overcurrent $I_D$ is between from zero up to the saturated value, so that the FET 60 is not turned off until the mechanism of a minor overcurrent protection (the output of the counter 70 of FIG. 8 becomes H) actuates.

$R_X$ is the resistance between the source of the FET 60 and ground; because it is the parallel combined resistance of the resistance $R_{66}$ of the load 66 and the ground resistance $R_{67}$ in FIG. 8, it is expressed as follows.

$$R_X = R_{66} \times R_{67}/(R_{66}+R_{67})$$

When the inrush current $I_D$ flows through the load 66, $R_{66}$ is small; however, when a stable current flows through the load 66, $R_{66}$ is larger than $R_{67}$ and $R_X \approx R_{67}$ is established.

It should be noticed that when $K_1$ is determined, $R_X$ is determined according to $K_1$ and that when the resistance between the source of the FET 60 and ground becomes smaller than $R_X$, an overcurrent flowing at that time is completely terminated before saturation regardless of the path length from the source of the FET 60 to the ground resistance 67 or to the load 66.

$R_X$ may comprise one resistor or a parallel combined resistance of plural resistors. In addition, when the resistance between the source of the FET 60 and ground become larger than $R_X$, $[V_{DS} < V_{DSD}]$ is satisfied, so that the current flowing through the FET 60 is not cut off at the level detection by the threshold value $V_{DSD}$. That is, when $K_1$ is set, $R_X$ according to $K_1$ is determined by equation (37); the determination of an overcurrent is performed based on whether or not the resistance between the source of the FET 60 and ground is smaller than $R_X$.

When the resistance between the source of the FET 60 and ground is equal to $R_X$, the curve that converts the drain current $I_D$ of the FET 60 to $V_{DS}$ is positioned between curves 1 and 2 in FIG. 9 (1) and overlaps the curve of $V_{DSDK1}$ (not shown) at the saturated state.

In the above explanation, although $V_{DSD}$ is set at first, and then $R_X$ according to $V_{DSD}$ is determined, in a practical overcurrent detection, $R_X$ may be set at first, and then $V_{DSD}$ according to $R_X$ may be determined. This procedure is explained below.

(1) The current flowing through the FET 60 depends on the resistance between the source of the FET 60 and ground.

(2) For each current, the lower limit within the current range, in which the overcurrent is determined, is set, and then the resistance $R_X$ between the source of the FET 60 and ground at that time is determined.

(3) $K_1$ that satisfies $[K_1 = R_{ON}/(R_{23} \times R_X)]$ is determined with respect to $R_X$. In addition, the threshold value $V_{DSD}$ $([V_{DSD} = K_1 \times R_{23} \times V_1])$ that determines $V_{DS}$ (magnitude) is set using the determined $K_1$. That is, the threshold value $V_{DSD}$ varies in accordance with $V_1$ (i.e. $V_{DSD}$ is proportional to $V_1$ times the proportionality constant $(K_1 \times R_{23})$).

(4) When $V_{DSD}$ is set in this manner, $V_{DS}$ is equal to $V_{DSD}$ $([V_{DS} = V_{DSD}])$ at the saturated state of an overcurrent that depends on the resistance between the source of the FET 60 and ground and is equal to the lower limit of the overcurrent range (at this time, the resistance between the source of the FET 60 and ground is $R_X$). On the other hand, $V_{DS}$ is larger than $V_{DSD}$ $([V_{DS} > V_{DSD}])$ at the saturated state of an overcurrent (an overcurrent having a value exceeding the lower limit) that flows in case the resistance between the source of the FET 60 and ground is smaller than $R_X$. Therefore, by comparing $V_{DS}$ with the threshold value $V_{DSD}$, it is possible to detect an overcurrent as the state when the resistance between the FET 60 and ground is $R_X$ or less.

(5) In case it is necessary to change the range that determines the overcurrent so that the resistance $R_X$ between the FET 60 and ground varies, the threshold values (for example, $V_{DSA}$, $V_{DSD}$ etc.,) are set by changing $K_1$ in accordance therewith.

(6) Herein, $K_1$ is determined according to the equation $[K_1 = R_{ON}/(R_{23} \times R_X)]$ (refer to equation (37)) by using $R_X$. This equation includes $R_{ON}$. $R_{ON}$ varies depending on the channel temperature of the FET 60. Thus, when the channel temperature of the FET 60 varies, $R_{ON}$ varies and $K_1$ is not a constant value. On the other hand, $K_1$ cannot follow the variations of $R_{ON}$ since it is set by the resistance $R_{95}$ of the resistor 95 of FIG. 8. Therefore, it is necessary to consider the variations of the channel temperature of FET 60 to reliably perform the overcurrent protection.

One solution that can be considered is a method that sets $R_X$ such that $(R_{ON}/R_X)$ becomes a constant. For example, $K_1$ is set by using the on-resistance $R_{ON125}$ at the upper temperature (e.g., 125° C.) of the operating ambient temperature of the FET 60. Furthermore, in case the ambient temperature becomes lower than the upper ambient temperature limit and so $R_{ON}$ becomes smaller than $R_{ON125}$, it is configured such that $R_X$ is reduced in proportion to the decrease of $R_{ON}$ and the lower limit of the current range, in which an overcurrent is determined, is increased in inverse proportion to $R_{ON}$. That is, it is configured such that $V_{DS}$ becomes equal to $V_{DSD}$ $[V_{DS} = V_{DSD}]$ at the saturated state when a current flows that has a current value that is larger by a value corresponding to the decrease of $R_{ON}$ than the lower limit of the current range, in which an overcurrent is determined. It is noted that, as the operating ambient temperature of FET 60 when setting $K_1$, an appropriate temperature can be selected within the temperature range that operation of the FET 60 is permitted.

It is noted that the interrelationship between $V_{DSD}$ and $V_1$, which is set such that $[V_{DS} = V_{DSD}]$ when an overcurrent (the resistance between the FET and the ground at this time is equal to $R_X$), which has a lower limit current value within the current range, which has been determined to be an overcurrent from among currents that flow depending on the resistance value between "FET 60 and ground, flows in a saturated state, and is set such that [$V_{DS}$>$V_{DSD}$] when an overcurrent (an overcurrent having a value greater than the lower limit value) flows in a saturated state in case the resistance between the FET and the ground is smaller than $R_X$, is equivalent to the interrelationship between $V_{DSD}$ and $V_1$, which is set such that the drain-source voltage is equal to the threshold value during the saturated state of the current in case the resistance value is at the upper limit within a resistance range that corresponds to the current range, which has been determined to be an overcurrent, and is set such that the drain-source voltage is larger than the threshold value during the saturated state of the current in case the resistance value is less than the upper limit of the resistance values.

However, even though the resistance values of the resistance between the FET and ground are the same, the current flowing through that resistance varies depending on the state of the voltage of the DC power source, the internal resistance of the DC power source, and the resistance, etc. of the power supply wiring on the power supply side. On the other hand, the resistance between the FET 60 and ground, which becomes the cause of overcurrents, does not vary according to the state of the power supplying side as in the current. Consequently, although the latter is equivalent to the former with regard to the obtained results, as a method that detects an overcurrent, it is not a method that detects current values, but it is appropriate to use a method that detects the resistance between the FET 60 and ground.

Next, FIG. 9 (2) will be explained. In FIG. 9 (2), curves (3A, 4A) regarding a first ground fault (incident A) and curves (3B, 4B) regarding a second ground fault (incident B) are shown. The resistance between the source of the FET 60 and ground is smaller than $R_X$ in both incidents A and B.

Curve 3A shows the drain-source voltage $V_{DS}$ of the FET 60 through which an overcurrent flows due to the first ground fault (The larger the current $I_D$ is, the larger $V_{DS}$, which is the voltage drop across FET 60, is). Curve 4A shows a threshold value $V_{DSD}$ when an overcurrent flows due to the first ground fault.

Curve 3B shows the drain-source voltage $V_{DS}$ of the FET 60 through which an overcurrent flows due to the second ground fault. Curve 4B shows a threshold value $V_{DSD}$ when an overcurrent flows due to the second ground fault.

In FIG. 8, although those ground faults were assumed to occur at point P within the electric power supply circuit 6, the magnitude of the overcurrent (attained current value or saturated value: the larger this is, the larger the rate of increase is) that flows due to ground fault depends on the ground point, the value of the ground resistance 67, etc.

In FIG. 9 (2), the situation is shown in which the attained current value of the overcurrent of the second ground fault is larger (the rate of increase is larger) than the attained current value of the overcurrent of the first ground fault. Thus, curve 3B increases more rapidly than curve 3A and it is located on the upper side thereof.

In addition, as was mentioned above, as the attained current value of the overcurrent is larger, the saturated value of the voltage $V_1$ is smaller; $V_{DSD}$ which varies according to $V_1$ is also smaller. Thus, the curve of $V_{DSD}$ (curve 4B) of the situation that the attained current value of the overcurrent is large is smaller than the curve of $V_{DSD}$ (curve 4A) of the situation that the attained current value of the overcurrent is small (curve 4B is located on the lower side of curve 4A).

Now, the situations of the first ground faults (curves 3A, 4A) will be considered. With both the first ground fault and the second ground fault, because the resistance between the source of the FET 60 and ground is smaller than $R_X$, the $V_{DS}$ value of the overcurrent $I_D$ becomes larger than the threshold value $V_{DSD}$ at the saturated state.

The initial value of $V_{DS}(=R_{ON}\times I_D)$ is zero because the current $I_D$ starts from zero. The initial value of $V_1$ is not zero because counter electromotive forces are generated by the increasing current flowing through the inductance associated with the path length, except in the special case when the path length from the FET 60 to the ground point P is zero. Thus, the initial value of $V_{DSD}$ which is determined in accordance with $V_1$ is also not zero.

Therefore, $V_{DS}$ initially starts from a value that is smaller than $V_{DSD}$, then monotonically increases, and finally becomes larger than $V_{DSD}$ in the saturated state. That is, there is a point where $V_{DS}$ becomes equal to $V_{DSD}$ before reaching the saturated value.

That time point is t1 shown in FIG. 9 (2) which corresponds to intersecting point $C_1$ where curve 3A and curve 4A cross each other. At that point, because $V_{DS}$ becomes equal to $V_{DSD}$ ([$V_{DS}=V_{DSD}$]), the output of the comparator 33 becomes H, and the output of the digital filter 71 becomes H after the above-described operation. As a result, the overcurrent protection is performed and the FET 60 is turned off.

Next, the situation of the second ground fault (curves 3B, 4B) will be considered. In this case, the point when $V_{DS}$ becomes equal to $V_{DSD}$ is the time point t2 which corresponds to intersecting point $C_2$ where curve 3B and curve 4B cross each other. Therefore, the overcurrent protection is performed at the time point $t_2$.

Comparing $t_1$ and $t_2$, $t_2$ is earlier than $t_1$. The reason is that intersecting point $C_2$ is the point where curve 3B of which the rate of increase is larger than that of curve 3A (located on the upper side of the curve 3A) and curve 4B of which the threshold value $V_{DSD}$ is smaller than that of curve 4A (located on the lower side of the curve 4A) cross each other, and so point $C_2$ exists earlier than point $C_1$ (is located on the left side of the point $C_1$).

This means that the larger the attained current value (the rate of increase) is, the earlier the overcurrent protection is performed. That is, although the fifth embodiment does not have the second overcurrent protection signal generating circuit 8, which generates the overcurrent protection signal by detecting the rate of increase as in the first to the fourth embodiments, it performs the overcurrent protection at an earlier stage as the attained current value is larger (the rate of increase is larger). As a result, in practice the fifth embodiment has the same effect that overcurrent protection is performed by detecting the rate of increase, similar to the first to fourth embodiments.

The present teachings may be added to, changed, replaced with alternatives or otherwise modified without departing from the spirit and scope of the present invention.

Although an overcurrent protection power supply apparatus is described in the claims that has a drain-source voltage detection initiation circuit that prevents malfunctions when the power is turned on, an overcurrent protection power supply apparatus according to the present teachings is not required to have a drain-source voltage detection initiation circuit.

The power switching device is not restricted to MOSFETs, and other kinds of FETs can be used.

The condition that $V_{DS}$ is larger than a threshold value (for example, $V_{DSA}$, $V_{DSB}$, $V_{DSC}$, $V_{DS}$) ([$V_{DS}$>threshold value]) can be replaced by the condition that $V_{DS}$ is larger than or equal to a threshold value ([$V_{DS}\geq$threshold value]).

Although the overcurrent protection power supply apparatus of the present invention is preferably used when supplying electric power from a high voltage DC power source to a load, it can be used when supplying to a load from DC power sources of various voltages.

With respect to each of the power supply circuit, the drain-source voltage detection circuit, the drain-source voltage detection initiation circuit, the first overcurrent protection signal generating circuit and the second overcurrent protection signal generating circuit, it is possible to use a variety of configurations within a range that does not depart from the scope of the invention.

In the embodiments, in order to set different threshold values for the drain-source voltage, although a reducing circuit that reduces (decreases) the magnitude of the detection voltage (detection signal) is provided, a pull up circuit that pulls up (increases) the reference voltage (reference signal) can be provided.

Each of the features described in the embodiments can be utilized separately or in combinations with a plurality of suitably selected features.

Another embodiment of the present teachings may be configured as follows.

An overcurrent protection power supply apparatus having a power supply circuit that supplies electric power from a DC power source to a load via a FET and a control circuit that controls the FET, the control circuit protecting the power supply circuit from overcurrents by turning off the FET, the apparatus comprising a drain-source voltage detecting circuit that detects a drain-source voltage generated between the drain and the source by a drain current flowing through the FET, a drain-source voltage detection initiation circuit that initiates the detection operation of the drain-source voltage by the drain-source voltage detecting circuit when the FET turns on after the drain-source voltage increases in accordance with an increase of the drain current of the FET, and a first overcurrent protection signal generating circuit that outputs a first overcurrent protection signal based on the drain-source voltage, wherein the control circuit is configured to turn off the FET when the first overcurrent protection signal is output from the first overcurrent protection signal generating circuit, and wherein the drain-source voltage detection circuit is configured to detect the drain-source voltage by a magnitude determination using a threshold value that varies according to an electric potential of an electrode of the DC power source side of the FET, wherein the relationship between the threshold value and the electric potential of the electrode of the DC power source side of the FET is set such that when the operating ambient temperature of the FET is a predetermined temperature at the time of the on resistance of the FET, the drain-source voltage is equal to the threshold value in case a resistance value between the FET and ground is at an upper limit of a resistance value range that corresponds to a current value range that is determined to be an overcurrent, the drain-source voltage is greater than the threshold voltage during saturation of the current in case the resistance is less than the resistance value upper limit, and wherein, when the on-resistance of the FET decreases due to the operating ambient temperature of the FET being lower than the predetermined temperature, the drain-source voltage is equal to the threshold value at a saturated state in case the current flows through a resistance value that is lower than the upper limit of the on resistance of the resistance value range that corresponds to the current value range that is determined to be an overcurrent, and when the on-resistance of the FET increases due to the operating ambient temperature of the FET being higher than the predetermined temperature, so that, the drain-source voltage is equal to the threshold value at a saturated state when the current flows through a resistance value that exceeds, by the increase of the on resistance, the upper limit of the on resistance of the resistance value range that corresponds to the current value range that is determined to be an overcurrent.

As the "predetermined temperature", for example it is possible to set any temperature within the range between the upper limit temperature and a lower limit temperature of the permissible operating ambient temperatures of the FET.

1—overcurrent protection power supply apparatus, 2—drain-source voltage detecting circuit, 4—drain-source voltage detection initiation circuit, 6—electric power supply circuit, 7—first overcurrent protection signal generating circuit, 8—second overcurrent protection signal generating circuit, 9—constant voltage circuit, 10—switch circuit, 11—switch, 12—resistor, 13—charge pump circuit, 14—drive circuit, 15—resistor, 16—control circuit, 17—OR circuit, 20, 21—constant current source, 22—FET, 23-25—resistor, 26-28—FET, 29—resistor, 30—constant current source, 31, 32—resistor, 33, 34—comparator, 35—resistor, 36, 37—constant current source, 38-40—FET, 41—resistor, 42—Zener diode, 43—resistor, 44—FET, 45, 46—diode, 47—resistor, 48—FET, 49-51—resistor, 52—Zener diode, 53—comparator, 54—DC power source, 60—FET, 61—resistor, 62—inductor, 63—DC power source, 64, 65—inductor, 66—load, 67—ground resistor, 70—counter, 71—digital filter, 72—AND circuit, 73—timer, 74-76—AND circuit, 80—D type flip-flop, 81—DC power source, 82, 83—counter, 84—AND circuit, 85—clock circuit, 86—AND circuit, 90—Zener diode, 91—capacitor, 92—resistor, 93, 94—FET, 95—resistor, 96-98—FET, 101—overcurrent protection power supply apparatus, 102—switch circuit, 103—switch, 104—resistor, 105—control circuit, 106—resistor, 107—comparator, 108—overcurrent detecting circuit, 109—multi-source FET, 110—sub FET, 111—main FET, 112—temperature sensor, 113—reference voltage generating circuit, 114—resistor, 115—wire, 116—load, 117, 121—DC power source, 120—detecting voltage reducing circuit, 122, 123—D type flip-flop, 124—drain-source threshold value setting circuit, 141, 142—FET, 150—Zener diode, 151—photo-coupler, 152—negative electrode line, 153—FET

The invention claimed is:

1. An overcurrent protection power supply apparatus having a power supply circuit that supplies electric power from a DC power source to a load via a FET and a control circuit that controls the FET, the overcurrent protection power supply apparatus protecting the power supply circuit from overcurrents by turning off the FET, the apparatus comprising:

a drain-source voltage detecting circuit configured to detect a drain-source voltage between a drain and a source of the FET generated by a drain current flowing through the FET, a malfunction preventing circuit configured to initiate a detecting operation of the drain-source voltage detecting circuit when the FET is turned on and after the drain-source voltage increases in accordance with an increase of the drain current of the FET, a first overcurrent protection signal generating circuit configured to generate and output a first overcurrent protection signal based on the drain-source voltage, and a second overcurrent protection signal generating circuit configured to generate and output a second overcurrent protection signal when a rate of increase of the drain-source voltage exceeds an excessive rate-of-increase threshold,
wherein the control circuit is configured to turn off the FET when at least one of the following conditions is met: (i) the first overcurrent protection signal is output from the first overcurrent protection signal generating circuit or (ii) the second overcurrent protection signal is output from the second overcurrent protection signal generating circuit, and
the second overcurrent protection signal generating circuit is configured to measure a time interval from when the drain-source voltage becomes larger than a first threshold value until when the drain-source voltage becomes larger than a third threshold value, which is larger than the first threshold value, and to set, based upon the measured time interval, a reference time interval that is longer than the measured time interval.

2. An overcurrent protection power supply apparatus having a power supply circuit that supplies electric power from a DC power source to a load via a FET and a control circuit that controls the FET, the overcurrent protection power supply apparatus protecting the power supply circuit from overcurrents by turning off the FET, the apparatus comprising:
a drain-source voltage detecting circuit configured to detect a drain-source voltage between a drain and a source of the FET generated by a drain current flowing through the FET,
a first overcurrent protection signal generating circuit configured to generate and output a first overcurrent protection signal based on the drain-source voltage,
a malfunction preventing circuit configured to: (i) disable the drain-source voltage detecting circuit from detecting the drain-source voltage while the FET is transitioning from its off-state to its on-state and before the drain current of the FET begins to increase and then cause the drain-source voltage detecting circuit to begin to detect the drain-source voltage when the FET is turned on and as soon as the drain current of the FET begins to increase, or (ii) disable the first overcurrent protection signal generating circuit from generating the first overcurrent protection signal while the FET is transitioning from its off-state to its on-state and before the drain current of the FET begins to increase and then enable the first overcurrent protection signal generating circuit to generate the first overcurrent protection signal when the FET is turned on and as soon as the drain current of the FET begins to increase,
wherein:
the control circuit is configured to turn off the FET when the first overcurrent protection signal is output from the first overcurrent protection signal generating circuit,
the drain-source voltage detecting circuit is configured to detect the drain-source voltage by comparing a magnitude of the drain-source voltage with a threshold value,
said threshold value being variable in accordance with an electric potential of an electrode of the DC power source side of the FET, and
the threshold value is set such that: (i) the magnitude of the drain-source voltage is equal to the threshold value at a saturated state of a current flowing through a resistance between the FET and ground that is equal to an upper limit of a resistance range to a current value range that defines the overcurrent, and (ii) the magnitude of the drain-source voltage is larger than the threshold value at a saturated state of the current flowing through the resistance that is less than the upper limit of the resistance range.

3. The overcurrent protection power supply apparatus according to claim 1 wherein:
the first overcurrent protection signal generating circuit has a timer configured to output a timer clock signal during a predetermined timer period starting when the drain-source voltage becomes larger than the first threshold value, and
the first overcurrent protection signal generating circuit is configured to output the first overcurrent protection signal when, within the predetermined timer period, (i) the drain-source voltage continues for a predetermined period to be larger than a second threshold value, which is larger than the first threshold value, or (ii) the timer clock signal has been output from the timer a predetermined number of times.

4. The overcurrent protection power supply apparatus according to claim 1 wherein:
the second overcurrent protection signal generating circuit is configured to output the second overcurrent protection signal when the drain-source voltage becomes larger than a fourth threshold value, which is larger than the third threshold value, between when the drain-source voltage became larger than the first threshold value and when the reference time interval has elapsed.

5. The overcurrent protection power supply apparatus according to claim 1 wherein:
the drain-source voltage detecting circuit includes a first source follower circuit, a second source follower circuit, a threshold value setting circuit and a comparator,
the first source follower circuit has a first P type MOSFET, wherein its source is connected via a first resistor to an electrode of the load side of the FET, and a common gate potential is supplied to a gate of the first P type MOSFET,
the second source follower circuit has a second P type MOSFET, wherein its source is connected via a second resistor to an electrode of the DC power source side of the FET, the second resistor having a resistance value equal to a resistance value of the first resistor, and the common gate potential is supplied to a gate of the second P type MOSFET, the second source follower circuit being configured such that a drain current of the second P type MOSFET varies according to a value obtained by subtracting the first threshold value from the drain-source voltage of the FET,
the threshold value setting circuit is configured to vary the drain current of the second P type MOSFET by drawing a current, which varies according to an electric potential of an electrode of the DC power source of the FET, from the source of the second P type MOSFET, and
the comparator is configured to detect when the drain current of the second P type MOSFET becomes larger than a drain current of the first P type MOSFET.

6. The overcurrent protection power supply apparatus according to claim 1 wherein
the FET is an N type MOSFET, and
the malfunction preventing circuit is configured to initiate the detection operation by the drain-source voltage detecting circuit when an electric potential of a gate of the N type MOSFET becomes larger than an electric potential of a drain of the N type MOSFET.

7. The overcurrent protection power supply apparatus according to claim 1 wherein the FET is a P type MOSFET, and the malfunction preventing circuit is configured to initiate the detection operation by the drain-source voltage detecting circuit when an electric potential of a gate of the P type MOSFET becomes smaller than an electric potential of a drain of the P type MOSFET.

8. The overcurrent protection power supply apparatus according to claim 1, further comprising:

a constant voltage circuit configured to hold a voltage that is supplied to the drain-source voltage detecting circuit and to the malfunction preventing circuit at a constant voltage that is lower than the voltage of the DC power source.

9. The overcurrent protection power supply apparatus according to claim 2 wherein:

the first overcurrent protection signal generating circuit has a timer configured to output a timer clock signal during a predetermined timer period starting when the drain-source voltage becomes larger than a first threshold value, and the first overcurrent protection signal generating circuit is configured to output the first overcurrent protection signal when, within the predetermined timer period, (i) the drain-source voltage continues for a predetermined period to be larger than a second threshold value, which is larger than the first threshold value, or (ii) the timer clock signal has been output from the timer a predetermined number of times.

10. The overcurrent protection power supply apparatus according to claim 2 wherein:

the drain-source voltage detecting circuit includes a first source follower circuit, a second source follower circuit, a threshold value setting circuit and a comparator, the first source follower circuit has a first P type MOSFET, wherein its source is connected via a first resistor to an electrode of the load side of the FET and a common gate potential is supplied to a gate of the first P type MOSFET, the second source follower circuit has a second P type MOSFET, wherein its source is connected via a second resistor to an electrode of the DC power source side of the FET, the second resistor having a resistance value equal to a resistance value of the first resistor, and the common gate potential is supplied to a gate of the second P type MOSFET, the second source follower circuit being configured such that a drain current of the second P type MOSFET varies according to a value obtained by subtracting the threshold value from the drain-source voltage of the FET, the threshold value setting circuit is configured to vary the drain current of the second P type MOSFET by drawing a current, which varies according to the electric potential of the electrode of the DC power source of the FET from the source of the second P type MOSFET, and the comparator is configured to detect when the drain current of the second P type MOSFET becomes larger than a drain current of the first P type MOSFET.

11. The overcurrent protection power supply apparatus according to claim 2 wherein:

the FET is an N type MOSFET, and the malfunction preventing circuit is configured to initiate the detection operation by the drain-source voltage detecting circuit when an electric potential of a gate of the N type MOSFET becomes larger than an electric potential of a drain of the N type MOSFET.

12. The overcurrent protection power supply apparatus according to claim 2 wherein:

the FET is a P type MOSFET, and the malfunction preventing circuit is configured to initiate the detection operation by the drain-source voltage detecting circuit when an electric potential of a gate of the P type MOSFET becomes smaller than an electric potential of a drain of the P type MOSFET.

13. The overcurrent protection power supply apparatus according to claim 2, further comprising:

a constant voltage circuit configured to hold a voltage that is supplied to the drain-source voltage detecting circuit and to the malfunction preventing circuit at a constant voltage that is lower than the voltage of the DC power source.

14. A power supply apparatus configured to supply power to a load, comprising:

a DC power source, a power FET electrically coupled to the DC power source, the power FET having a source, a drain and a gate, a control circuit electrically coupled to the gate of the power FET and configured to turn the power FET on and off, a voltage detecting circuit configured to detect a drain-source voltage across the power FET, a first overcurrent detection circuit configured to generate a first overcurrent signal when the voltage detecting circuit determines that an absolute value of the detected drain-source voltage exceeds an excessive drain-source voltage threshold and to output the first overcurrent signal to the control circuit, and a second overcurrent detection circuit configured to generate a second overcurrent signal when a detected rate of increase of the detected drain-source voltage exceeds an excessive rate-of-increase threshold and to output the second overcurrent signal to the control circuit, wherein the control circuit is configured to turn the FET off upon receiving one or both of the first overcurrent signal and the second overcurrent signal, and the second overcurrent detection circuit is configured to measure a time interval from when the drain-source voltage becomes larger than a first threshold value until when the drain-source voltage becomes larger than a third threshold value, which is larger than the first threshold value, and to set, based upon the measured time interval, a reference time interval that is longer than the measured time interval.

15. The power supply apparatus according to claim 14, wherein:

the first overcurrent detection circuit has a timer configured to output a clock signal during a predetermined timer period starting when the drain-source voltage becomes larger than the first threshold value, and the first overcurrent detection circuit is configured to output the first overcurrent signal in response to at least one of the following conditions being met within the predetermined timer period: (i) the drain-source voltage is larger than a second threshold value for a predetermined period of time, the second threshold value being larger than the first threshold value, or (ii) the clock signal has been output from the timer a predetermined number of times.

16. The power supply apparatus according to claim 14 wherein: the second overcurrent detection circuit is further configured to output the second overcurrent signal when the drain-source voltage becomes larger than a fourth threshold value, which is larger than the third threshold value, between a time when the drain-source voltage became larger than the first threshold value and a time when the reference time interval has elapsed.

17. The power supply apparatus according to claim 14 wherein:
the voltage detecting circuit includes a first source follower circuit, a second source follower circuit, a threshold value setting circuit and a comparator,
the first source follower circuit includes a first P type MOSFET having a source connected via a first resistor to a node between the load and the power FET, the first P type MOSFET outputting a first drain current,
the second source follower circuit includes a second P type MOSFET having a source connected via a second resistor to a node between the DC power source and the power FET, the second resistor having a resistance value equal to a resistance value of the first resistor and the second P type MOSFET outputting a second drain current,
a common gate potential is supplied to respective gates of the first and second P type MOSFETs,
the threshold value setting circuit is configured to vary the second drain current by drawing a current from a node between the second resistor and the source of the second P type MOSFET in accordance with the electric potential at the node between the DC power source and the power FET, and
the comparator is configured to change its output when the drain current of the second P type MOSFET becomes larger than the drain current of the first P type MOSFET.

18. A power supply apparatus configured to supply power to a load, comprising:
a DC power source,
a power FET electrically coupled to the DC power source, the power FET having a source, a drain and a gate,
a voltage detecting circuit configured to detect a magnitude of a drain-source voltage across the power FET and to compare the magnitude of the drain-source voltage with a threshold value,
an overcurrent detection circuit configured to generate an overcurrent signal based on the comparison of the magnitude of the drain-source voltage with the threshold value, and
a control circuit in communication with an output of the overcurrent detection circuit and being configured to turn the power FET off upon receiving the overcurrent signal from the overcurrent detection circuit,
wherein the voltage detecting circuit includes a threshold value setting circuit configured to vary the threshold value in proportion to, or nearly proportional to, a voltage at a node between the DC power source and the power FET such that:
the threshold value is set to be equal to the drain-source voltage, which is determined when a current flowing through the power FET is in a saturated state, in case a resistance value representative of a total resistance between the power FET and ground is equal to an upper limit of a resistance range that is inversely proportional to a current value range that defines an overcurrent, and
the threshold value is set to be less than the drain-source voltage, which is determined when the current flowing through the power FET is in the saturated state, in case the resistance value is less than the upper limit of the resistance range.

19. The power supply apparatus according to claim 18, wherein:
the voltage detecting circuit further includes a first source follower circuit, a second source follower circuit and a comparator,
the first source follower circuit includes a first P type MOSFET having a source connected via a first resistor to a node between the load and the power FET, the first P type MOSFET outputting a first drain current,
the second source follower circuit includes a second P type MOSFET having a source is connected via a second resistor to the node between the DC power source and the power FET, the second resistor having a resistance value equal to a resistance value of the first resistor and the second P type MOSFET outputting a second drain current,
a common gate potential is supplied to respective gates of the first and second P type MOSFETs,
the threshold value setting circuit is configured to vary the second drain current by drawing a current from a node between the second resistor and the source of the second P type MOSFET that is proportional to, or nearly proportional to, the voltage at the node between the DC power source and the power FET, and
the comparator is configured to change its output when the drain current of the second P type MOSFET becomes larger than the drain current of the first P type MOSFET.

20. The power supply apparatus according to claim 19, further comprising:
a malfunction preventing circuit configured to detect respective voltages at the gate and at the drain of the power FET;
wherein the power FET is a P type power FET or an N type power FET,
in case the power FET is a N type power FET, the malfunction preventing circuit is configured to cause the voltage detecting circuit to begin detecting the drain-source voltage of the power FET when the gate voltage becomes greater than the drain voltage, and
in case the power FET is a P type power FET, the malfunction preventing circuit is configured to cause the voltage detecting circuit to begin detecting the drain-source voltage of the power FET when the gate voltage becomes less than the drain voltage.

\* \* \* \* \*